(12) United States Patent
Gonzalez et al.

(10) Patent No.: US 7,749,860 B2
(45) Date of Patent: Jul. 6, 2010

(54) METHOD FOR FORMING A SELF-ALIGNED T-SHAPED ISOLATION TRENCH

(75) Inventors: Fernando Gonzalez, Boise, ID (US); David Chapek, Boise, ID (US); Ranshir P. S. Thakur, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/392,034

(22) Filed: Sep. 8, 1999

(65) Prior Publication Data
US 2001/0046753 A1 Nov. 29, 2001

Related U.S. Application Data

(60) Continuation of application No. 08/985,588, filed on Dec. 5, 1997, now Pat. No. 5,953,621, which is a division of application No. 08/823,609, filed on Mar. 25, 1997, now Pat. No. 6,097,076.

(51) Int. Cl.
*H01L 21/764* (2006.01)
*H01L 29/00* (2006.01)

(52) U.S. Cl. ................ 438/437; 438/433; 438/524; 438/E21.546; 438/E21.551

(58) Field of Classification Search .......... 438/424, 438/430, 427, 435–437, 433, 524, 431; 257/397
See application file for complete search history.

(56) References Cited

U.S. PATENT DOCUMENTS 3,791,882 A 2/1974 Ogiue .................. 438/417

(Continued)

OTHER PUBLICATIONS

S. Wolf, Silicon Processing for the VLSI Era, Process Integration. vol. 2. Lattice Press 1990. pp. 54-55.*

(Continued)

*Primary Examiner*—Anh D Mai
(74) *Attorney, Agent, or Firm*—TraskBritt

(57) ABSTRACT

The present invention relates to a method for forming an isolation trench structure in a semiconductor substrate without causing deleterious topographical depressions in the upper surface thereof which cause current and charge leakage to an adjacent active area. The inventive method forms a pad oxide upon a semiconductor substrate, and then forms a nitride layer on the pad oxide. The nitride layer is patterned with a mask and etched to expose a portion of the pad oxide layer and to protect an active area in the semiconductor substrate that remains covered with the nitride layer. A second dielectric layer is formed substantially conformably over the pad oxide layer and the remaining portions of the first dielectric layer. A spacer etch is then carried out to form a spacer from the second dielectric layer. The spacer is in contact with the remaining portion of the first dielectric layer. An isolation trench etch follows the spacer etch. An optional thermal oxidation of the surfaces in the isolation trench may be performed, which may optionally be followed by doping of the bottom of the isolation trench to further isolate neighboring active regions on either side of the isolation trench. A conformal layer is formed substantially conformably over the spacer, over the remaining portions of the first dielectric layer, and substantially filling the isolation trench. Planarization of the conformal layer follows, either by CMP or by etchback or by a combination thereof. An isolation trench filled with a structure results. The resulting structure has a flange and shaft, the cross-section of which has a nail shape in cross-section.

37 Claims, 9 Drawing Sheets

U.S. PATENT DOCUMENTS

| | | | |
|---|---|---|---|
| 4,409,609 A | 10/1983 | Fukuda | 257/520 |
| 4,717,682 A | 1/1988 | Taka et al. | 438/361 |
| 4,819,052 A | 4/1989 | Hutter | 257/378 |
| 4,965,221 A | 10/1990 | Dennison et al. | 437/70 |
| 5,045,904 A | 9/1991 | Kobayashi et al. | 257/539 |
| 5,221,857 A | 6/1993 | Kano | 257/539 |
| 5,229,316 A * | 7/1993 | Lee et al. | |
| 5,387,534 A | 2/1995 | Prall | 438/287 |
| 5,387,540 A * | 2/1995 | Poon et al. | |
| 5,433,794 A | 7/1995 | Fazan et al. | 148/33 |
| 5,521,422 A * | 5/1996 | Mandelman et al. | 257/510 |
| 5,541,440 A | 7/1996 | Kozai et al. | 257/513 |
| 5,665,202 A * | 9/1997 | Subramanian et al. | 438/692 |
| 5,700,180 A * | 12/1997 | Sandhu et al. | 451/5 |
| 5,721,172 A * | 2/1998 | Jang et al. | 438/424 |
| 5,763,932 A * | 6/1998 | Pan et al. | 257/510 |
| 5,780,325 A | 7/1998 | Lee | 438/149 |
| 5,858,858 A * | 1/1999 | Park et al. | 438/424 |
| 5,943,590 A * | 8/1999 | Wang et al. | 438/427 |
| 6,069,083 A * | 5/2000 | Miyashita et al. | 438/693 |
| 6,097,072 A * | 8/2000 | Omid-Zohoor | 157/397 |
| 6,184,108 B1 * | 2/2001 | Omid-Zohoor et al. | 438/431 |

OTHER PUBLICATIONS

A. Chatterjee et al., A Shallow Trench Isolation Using LOCOS Edge for Preventing Corner Effects for 0.25/0.18 Micron CMOS Technologies and Beyond. IEDM 1996, pp. 829-832.*

K. Ohe et al. Narrow-Width Effects of Shallow Trench Isolated CMOS with n+ Polysilicon Gate. IEEE 1989, pp. 1110-1116.*

G. Fuse et al., A New Isolation Method with Boron-Implanted Sidewalls for Controlling Narrow-Width Effect, IEEE 1987, pp. 356-360.*

S. Wolf, Silicon Processing for the VLSI Era, vol. 2; Process Integration, Lattice Press, pp. 54-56, 1990.

Stanley Wolf, Silicon Processing for the VLSI Era, vol. 2: Process Integration, Lattice Press, p. 331, 1990.

T. Ishijima, et al., "A Deep Sub-Micron Isolation Technology With T-Shaped Oxide (TSO) Structure," IEEE Publication No. Ch2865-4/90/0000-0257 (1990), pp. 257-260.

* cited by examiner

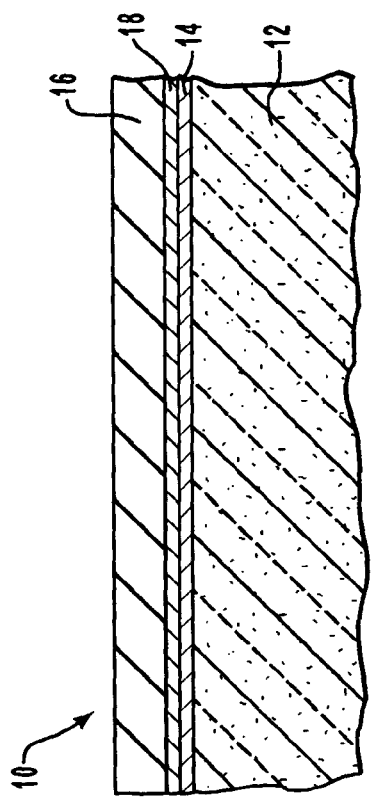
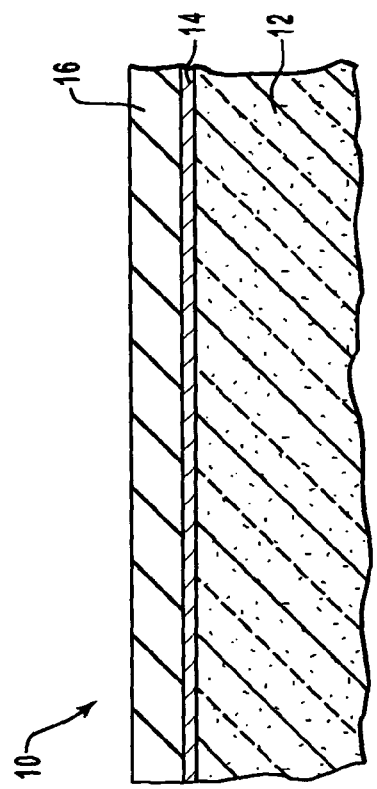
FIG. 2A
FIG. 2B

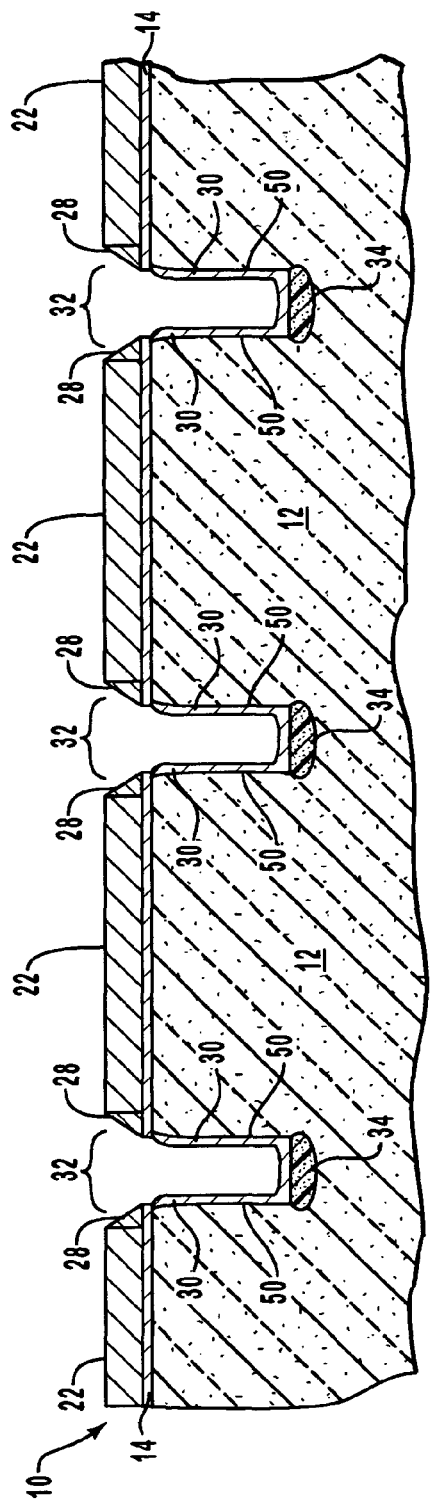
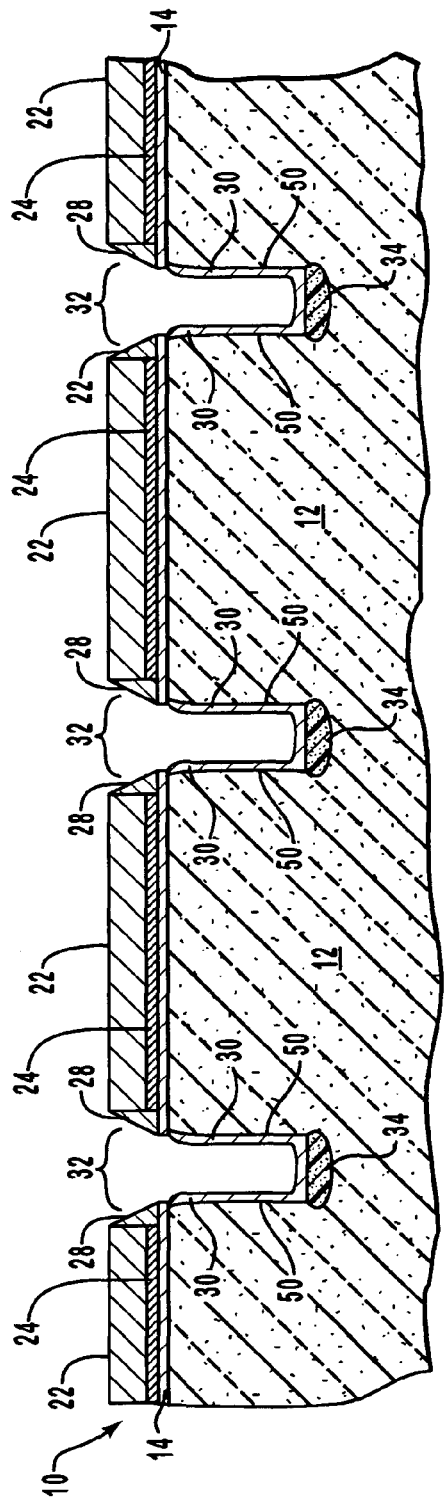
FIG. 5A
FIG. 5B

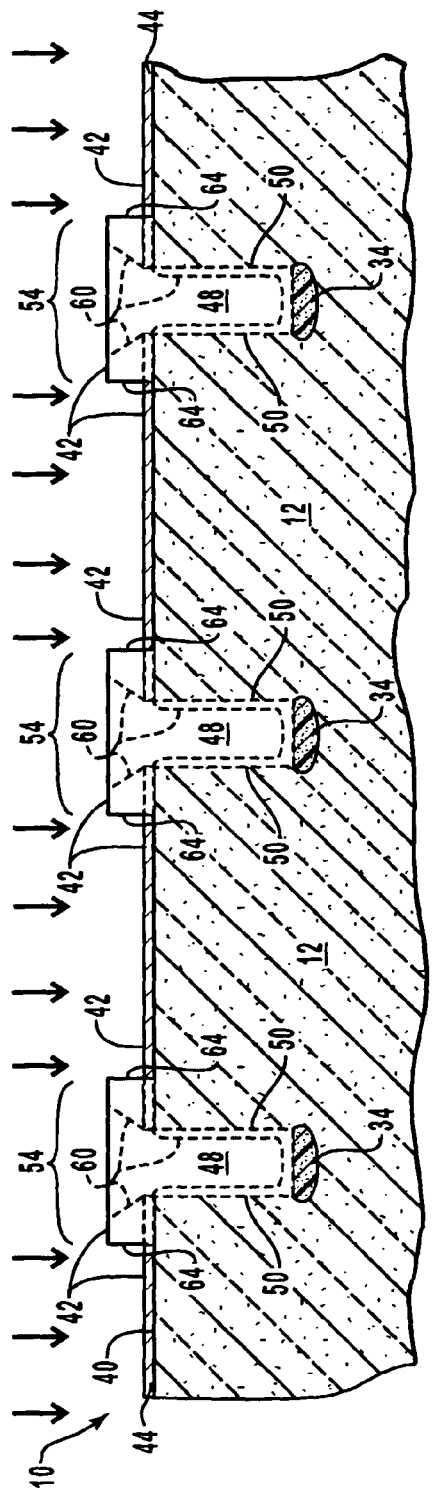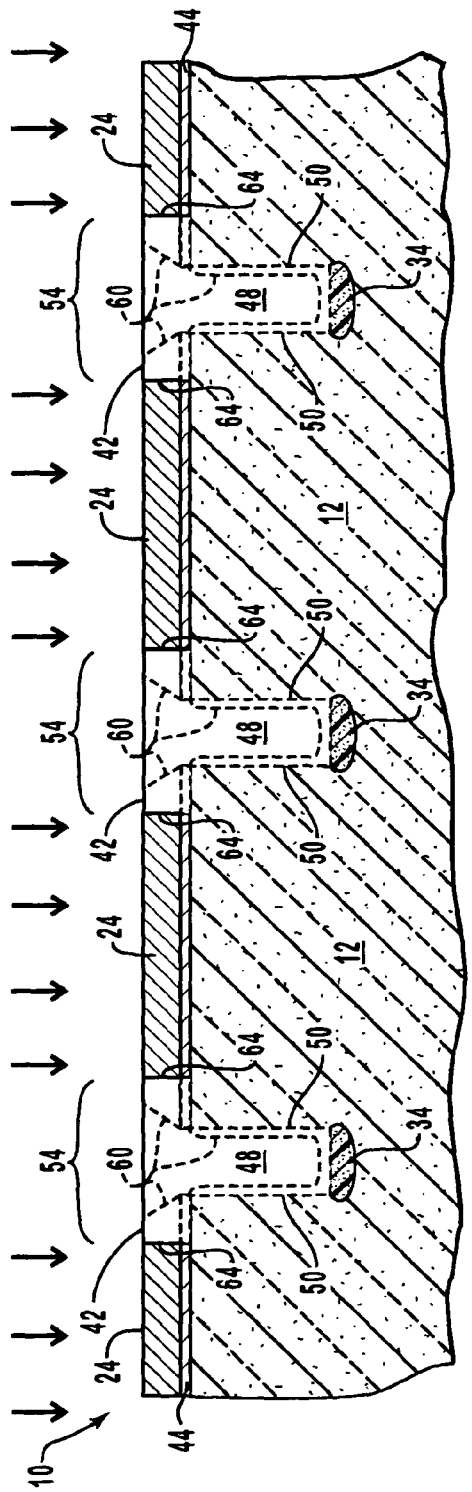

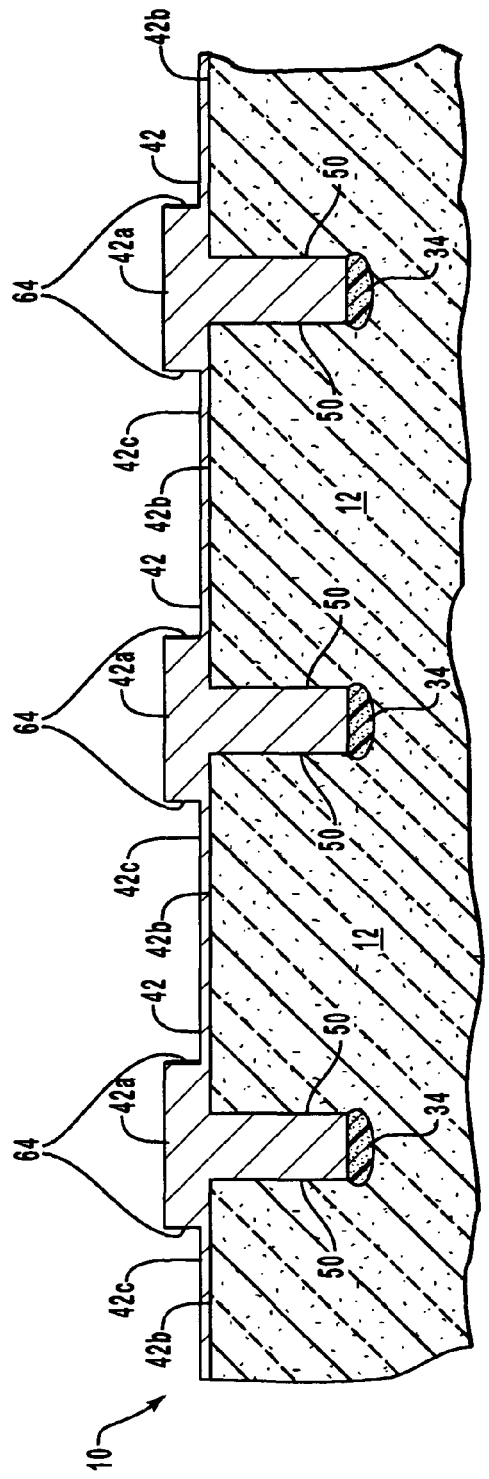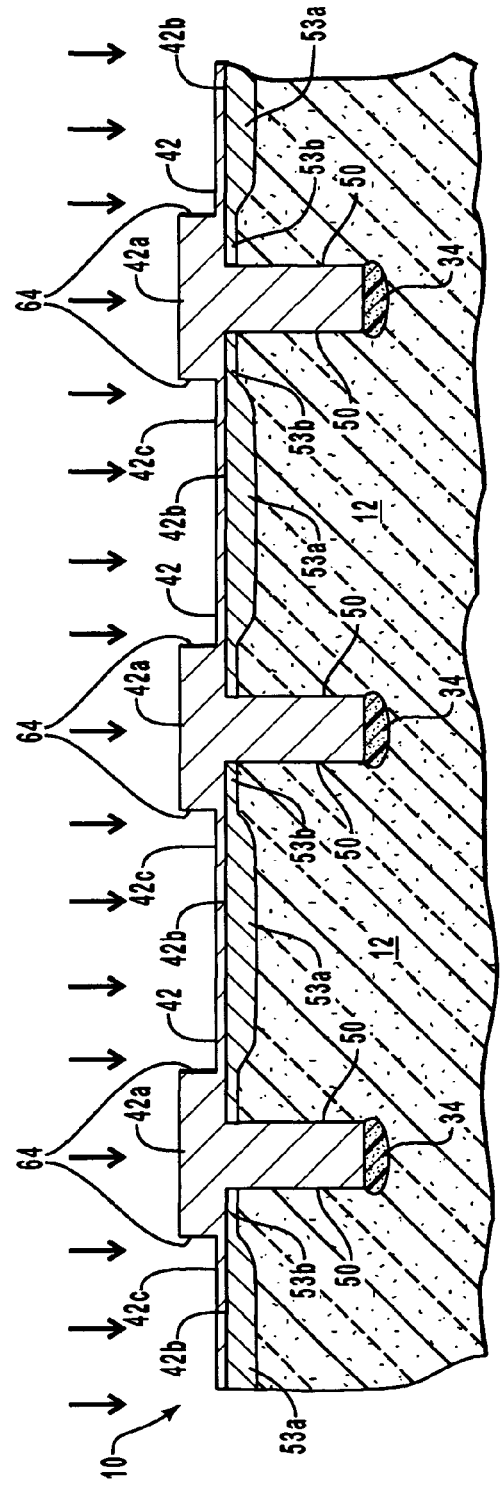

METHOD FOR FORMING A SELF-ALIGNED T-SHAPED ISOLATION TRENCH

This application is a continuation of U.S. patent application Ser. No. 08/985,588, filed on Dec. 5, 1997, now U.S. Pat. No. 5,953,621, issued Sep. 14, 1999, which is a divisional patent application of U.S. patent application Ser. No. 08/823,609, filed on Mar. 25, 1997, now U.S. Pat. No. 6,097,076, issued Aug. 1, 2000, both of which are incorporated herein by reference.

BACKGROUND OF THE INVENTION

1. The Field of the Invention

The present invention relates to forming an isolation trench in a semiconductor device. In particular, the present invention relates to a method of forming an isolation trench in an etching process for a semiconductor device that combines a spacer etch with a trench etch.

2. The Relevant Technology

An isolation trench is used in an active area associated with a microelectronic device on a semiconductor substrate or on a substrate assembly. Isolation trenches allow microelectronics devices to be placed increasingly closer to each other without causing detrimental electronic interaction such as unwanted capacitance build-up and cross-talk. In the context of this document, the term semiconductive substrate is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above. The term substrate assembly is intended herein to mean a substrate having one or more layers or structures formed thereon. As such, the substrate assembly may be, by way of example and not by way of limitation, a doped silicon semiconductor substrate typical of a semiconductor wafer.

The ever-present pressure upon the microelectronics industry to shrink electronic devices and to crowd a higher number of electronic devices onto a single die, called miniaturization, has required the use of such structures as isolation trenches.

In the prior state of the art, an etching process of fill material within an isolation trench has been problematic. As seen in FIG. 1, a semiconductor substrate 12 has an isolation trench substantially filled up with an isolation material 48. A pad oxide 14 is situated on the active area of semiconductor substrate 12. Isolation material 48 exhibits a non-planarity at the top surface thereof between corners 62, particularly as is seen at reference numeral 46 in FIG. 1. The non-planarity of the top surface of isolation material 48 is due to dissimilarity of etch rates between isolation material 48 and pad oxide 14, particularly at corners 62 of the active area of semiconductor substrate 12.

An active area may be formed within semiconductor substrate 12 immediately beneath pad oxide 14, and adjacent isolation material 48. A problem that is inherent in such non-planarity of fill material within an isolation trench is that corners 62 may leave the active area of semiconductor substrate 12 exposed. As such, isolation material 48 will not prevent layers formed thereon from contacting the active area of semiconductor substrate 12 at corners 62. Contact of this sort is detrimental in that it causes charge and current leakage. Isolation material 48 is also unable to prevent unwanted thermal oxide encroachment through corners 62 into the active area of semiconductor substrate 12.

What is needed is a method of forming an isolation trench, where subsequent etching of fill material within the isolation trench of such method prevents overlying layers from having contact with an adjacent active area, and prevents unwanted thermal oxide encroachment into the active area. What is also needed is a method of forming an isolation trench wherein etching or planarizing such as by chemical mechanical chemical-mechanical planarization (CMP) of isolation trench materials is accomplished without forming a recess at the intersection of the fill material in the isolation trench and the material of the active area within the semiconductor substrate.

SUMMARY OF THE INVENTION

The present invention relates to a method for forming an isolation trench structure on a semiconductor substrate. The inventive method forms and fills the isolation trench without causing deleterious topographical depressions in the upper surface of the fill material in the isolation trench, while substantially preventing contact between layers overlying the fill material of the isolation trench and the active area of the semiconductor substrate. By avoiding such deleterious topographical depressions and the exposure of the active area, detrimental charge and current leakage is minimized.

The inventive method of forming an isolation trench comprises forming a pad oxide upon a semiconductor substrate and depositing a first dielectric layer thereupon. By way of non-limiting example, the first dielectric layer is a nitride layer. The first dielectric layer is patterned and etched with a mask to expose a portion of the pad oxide layer and to protect an active area in the semiconductor substrate that remains covered with the first dielectric layer. A second dielectric layer is formed substantially conformably over the pad oxide layer and the remaining portions of the first dielectric layer.

A spacer etch is used to form a spacer from the second dielectric layer. The spacer electrically insulates the first dielectric layer. An isolation trench etch follows the spacer etch and creates within the semiconductor substrate an isolation trench that is defined by surfaces in the semiconductor substrate. The spacer formed by the spacer etch facilitates self-alignment of the isolation trench formed by the isolation trench etch. The isolation trench etch can be carried out with the same etch recipe as the spacer etch, or it can be carried out with an etch recipe that is selective to the spacer. Once the isolation trench is formed, an insulation liner on the inside surface of the isolation trench can be optionally formed, either by deposition or by thermal oxidation.

A third dielectric layer is formed substantially conformably over the spacer and the first dielectric layer so as to substantially fill the isolation trench. Topographical reduction of the third dielectric layer follows, preferably so as to planarize the third dielectric layer for example by chemical mechanical layer, for example, by chemical-mechanical planarizing (CMP), by dry etchback, or by a combination thereof.

The topographical reduction of the third dielectric layer may also be carried out as a single etchback step that sequentially removes superficial portions of the third dielectric layer that extend out of the isolation trench. The single etchback also removes portions of the remaining spacer, and removes substantially all of the remaining portions of the first dielectric layer. Preferably, the single etchback will use an etch recipe that is more selective to the third dielectric layer and the spacer than to the remaining portions of the first dielectric layer. The single etchback uses an etch recipe having a selectivity that will preferably leave a raised portion of the third dielectric layer extending above the isolation trench while removing substantially all remaining portions of the first dielectric layer. The resulting structure can be described as having the shape of a nail as viewed in a direction that is substantially orthogonal to the cross section cross-section of a word line in association therewith.

Several other processing steps are optional in the inventive method. One such optional processing step is the deposition of a polysilicon layer upon the pad oxide layer to act as an etch stop or planarization marker. Another optional processing step includes clearing the spacer following the isolation trench etch. An additional optional processing step includes implanting doping ions at the bottom of the isolation trench to form a doped trench bottom. When a CMOS device is being fabricated, the ion implantation process may require a partial masking of the semiconductor substrate so as to properly dope selected portions of the semiconductor substrate.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 2A is an elevational cross-section view of a semiconductor substrate, wherein a pad oxide and a nitride layer have been deposited upon the semiconductor substrate.

FIG. 2B is an elevational cross-section view of a semiconductor substrate having thereon a polysilicon layer that has been deposited upon a pad oxide, and a nitride layer that has been deposited upon the polysilicon layer.

FIGS. 5A and 5B illustrate further processing of the structure structures depicted, respectively, in FIGS. 4A and 4B, in which the insulation film has been etched to form a spacer, a simultaneous or serial etch has formed an isolation trench, thermal oxidation or deposition within the isolation trench has formed an insulation liner therein, and wherein an optional ion implantation has formed a doped region at the bottom of the isolation trench.

FIG. 8A illustrates further processing of the structure structures depicted in FIGS. 7A or 9A, wherein the semiconductor substrate has been implanted with ions, and wherein the isolation film, optionally the pad oxide layer, the insulation liner, and the spacer have fused to form a unitary isolation structure.

FIG. 8B illustrates optional further processing of the structure structures depicted in FIG. 6B, wherein an etching process using an etch recipe that is slightly selective to oxide over nitride, has etched back the isolation film, the nitride island, and the spacer to expose the polysilicon island, and has formed a filled isolation trench which, when viewed in a direction that is substantially orthogonal to the cross section cross-section of the depicted word line, has the shape of a nail.

FIG. 9A illustrates optional further processing of the structure structures depicted in FIG. 6A or in FIG. 7A, wherein an etch-selective recipe that is slightly selective to oxide over nitride has formed a filled isolation trench which, when viewed in cross section, cross-section has the shape of a nail.

FIG. 9B illustrates further processing of the structure structures depicted in either FIGS. 7B or 8B wherein the semiconductor substrate has been implanted with ions, and wherein the isolation film, optionally the pad oxide layer, the insulation liner, and the spacer have been fused to form a filled isolation trench.

DETAILED DESCRIPTION OF THE PREFERRED EMBODIMENTS

The present invention relates to a method for forming a self-aligned isolation trench. The isolation trench is preferably a shallow trench isolation region that is self-aligned to an underlying active area. Stated otherwise, the inventive method forms a Narrow self-aligned Active area Isolation region that is inherently Level (NAIL). In the method of the present invention, a spacer etch and an isolation trench etch can be accomplished essentially within the same processing step.

Another aspect of the present invention relates to a combined nitride and oxide etch that is selective to polysilicon, and in which selectivity of the etch between nitride and oxide materials favors one or the other by a factor of about one half A still further aspect of the present invention relates to the use of a polysilicon film as an etch stop or planarization marker film. The structure achieved by the method of the present invention achieves particular advantages that overcome problems of the prior art.

A starting structure for an example of a first embodiment of the present invention is illustrated in FIG. 2A. In FIG. 2A, a pad oxide 14 is grown upon a semiconductor substrate 12 on a semiconductor structure 10. Semiconductor substrate 12 can be substantially composed of silicon. Following growth of pad oxide 14, a nitride layer 16 is deposited over semiconductor substrate 12. FIG. 2A illustrates deposition of nitride layer 16 upon pad oxide 14.

Figure 1:
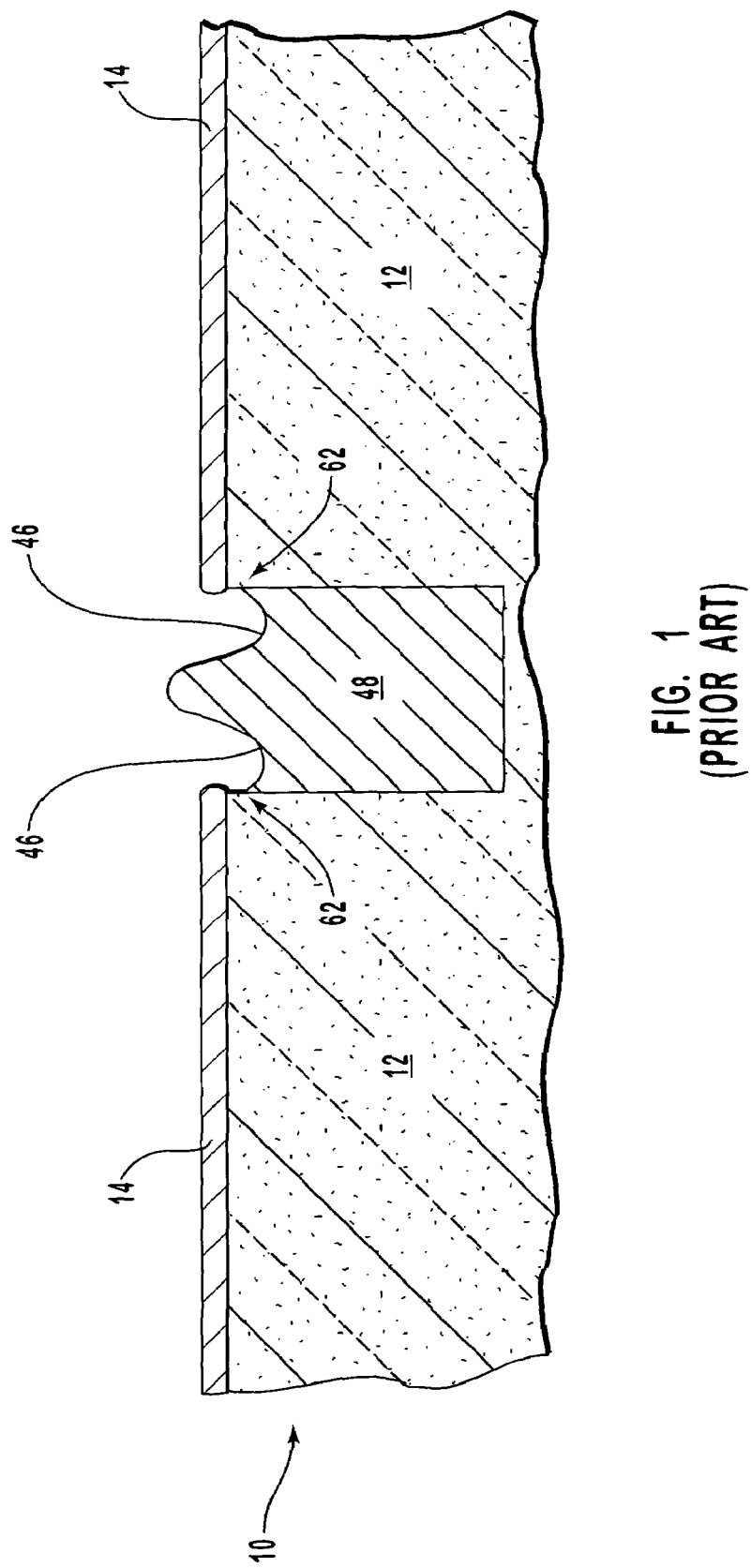
FIG. 1 illustrates the prior art problem of an uneven etch of an isolation trench that results in exposing portions of an active area and unwanted thermal oxide encroachment into the active area.
Figure 3A:
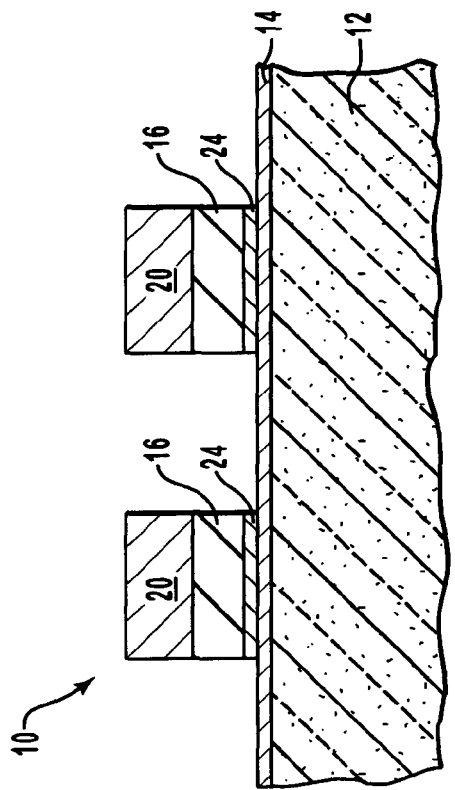
FIG. 3A illustrates further processing of the structure depicted in FIG. 2A, wherein a mask has been patterned and the nitride layer has been etched down to the pad oxide layer to form a nitride island over future or current active areas in the substrate that are to be protected.
Figure 4A:
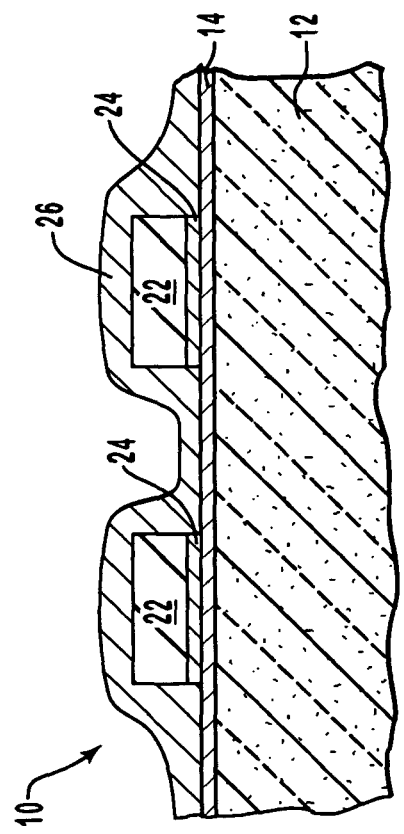
FIG. 4A is a view of further processing of FIG. 3A, wherein the mask has been removed and an insulation film has been deposited over the nitride island.

FIG. 3A illustrates a step in the formation of an isolation trench by the method of the present invention. Nitride layer 16 is patterned with a mask 20. An anisotropic etch selectively removes portions of nitride layer 16. FIG. 3A illustrates the result of etching with the use of mask 20, wherein nitride layer 16 has formed an insulator island 22, as seen in FIG. 4A. Insulator island 22 is patterned over and protects future or current active areas (not pictured) in semiconductor substrate 12 during isolation trench processing. Following etch of nitride layer 16, mask 20 is removed.

FIG. 4A illustrates further processing of the structure depicted in FIG. 3A, wherein an insulation film 26 has been deposited upon insulator island 22 and exposed portions of pad oxide 14. Insulation film 26 can be an oxide such as silicon dioxide, and can be formed for example by decomposition of tetraethyl ortho silicate orthosilicate (TEOS). Insulation film 26 may also be formed by a plasma enhanced chemical vapor deposition (PECVD) process so as to deposit a nitride layer such as Si.sub.3N.sub.4 $Si_3N_4$ or equivalent. When insulation film 26 is a nitride layer, insulator island 22 would be selected to be composed of a substantially different material, such as an oxide. Formation of substantially different materials between insulator island 22 and insulation film 26 facilitate selective etchback or selective mechanical planarization such as chemical-mechanical polishing (CMP) in the inventive method of forming an isolation trench.

Following deposition of insulation film 26, a spacer etch and an isolation trench etch are carried out. The spacer etch and the isolation trench etch can be carried out with a single etch recipe that is selective to insulation film 26. Alternatively, the spacer etch and the isolation trench etch can be carried out with two etch recipes. As such, the first etch etches insulation film 26 in a spacer etch that forms a spacer 28 seen in FIG. 5A. The second etch, or isolation trench etch, has an etch recipe that is selective to spacer 28 and insulator island 22, and anisotropically etches an isolation trench 32 having a sidewall 50 in semiconductor substrate 12.

Spacer 28 may facet during the spacer etch such that a substantially linear spacer profile is achieved. Spacer 28 adds the advantage to the inventive process of extending the lateral dimension of the active area that is to be formed within semiconductor substrate 12 immediately beneath insulator island 22. Because spacer 28 takes up lateral space that would otherwise be available for isolation trench 32, isolation trench 32 is made narrower and the active area that is to be formed within semiconductor substrate 12 is made wider.

Following the formation of isolation trench 32, sidewall 50 of isolation trench 32 has optionally formed thereon an insulation liner 30. For example, thermal oxidation of sidewall 50 will form insulation liner 30 within isolation trench 32. Insulation liner 30 will preferably be substantially composed of silicon dioxide. In FIG. 5A it can be seen that, following thermal oxidation of sidewall 50 to form insulation liner 30 within isolation trench 32, semiconductor substrate 12 forms a rounded edge at the of isolation trench 32. Rounding of the top of semiconductor substrate 12 at the corners of isolation trench 32 provides an added advantage of further isolating semiconductor substrate 12 immediately beneath insulator island 22; thereby an active area that will form in semiconductor substrate 12 immediately under insulator island 22 will be further isolated. The feature of rounding of the corners of semiconductor substrate 12 at the tops of isolation trenches 32 as depicted in FIGS. 5A and 5B is presupposed in all embodiments of the present invention as a preferred alternative.

Another method of forming insulation liner 30 is CVD of a dielectric material, or a dielectric material precursor that deposits preferentially upon sidewall 50 of isolation trench 32. The material of which insulation liner 30 is substantially composed may be particularly resistant to further etching, cleaning, or other processing conditions.

Insulation liner 30 may be substantially composed of a nitride such as $Si_3N_4$, or an equivalent, and can be selectively formed upon sidewall 50 of isolation trench 32. When semiconductor substrate 12 immediately adjacent to isolation trench 32 is a doped monocrystalline silicon that forms, for example, an active area for a transistor source/drain region, oxidation is avoided therein by insulation liner 30. Insulation liner is preferably substantially composed of $Si_3N_4$ or a non-stoichiometric variant that seals sidewall 50 so as to prevent encroachment of oxide into semiconductor substrate 12.

Following formation of insulation liner 30, ion implantation is optionally carried out to form a doped trench bottom 34 at the bottom of isolation trench 32. For example, if semiconductor wafer 10 comprises an N-doped silicon substrate, implantation of P-doping materials at the bottom of isolation trench 32 will form a P-doped trench bottom 34. Ion implantation may be carried out in a field implantation mode. If a complementary metal oxide semiconductor (CMOS) is being fabricated, however, masking of complementary regions of semiconductor substrate 12 is required in order to achieve the differential doping thereof. For an N-doped silicon substrate, a high breakdown voltage may be achieved by P-doping. A low breakdown voltage may be achieved by N-doping, and an intermediate breakdown voltage may be achieved by no doping. Because the present invention relates to formation of isolation trenches, P-doping in an N-well region, or N-doping in a P-well region are preferred.

Preferably, implantation of P-doping ions is carried out to form doped trench bottom 34 in a direction that is substantially orthogonal to the plane of pad oxide 14. Slightly angled implantation of P-implantation ions may be carried out to enrich or broaden the occurrence of P-doping ions in doped trench bottom 34 at the bottom of isolation trench 32. If P-doping is carried out where semiconductor substrate 12 is N-doped, care must be taken not to dope through insulation liner 30 on sidewall 50 near pad oxide 14, which may cause detrimental deactivation of active areas (not shown) in semiconductor substrate 12.

Following optional implantation of doping ions, it may be desirable, depending upon the intended shape and design of the isolation trench, to remove all or a portion of spacer 28. The isolation trench formed by the inventive method, however, will preferably include at least a portion of spacer 28 that extends away from the isolation trench 32.

Figure 6A:
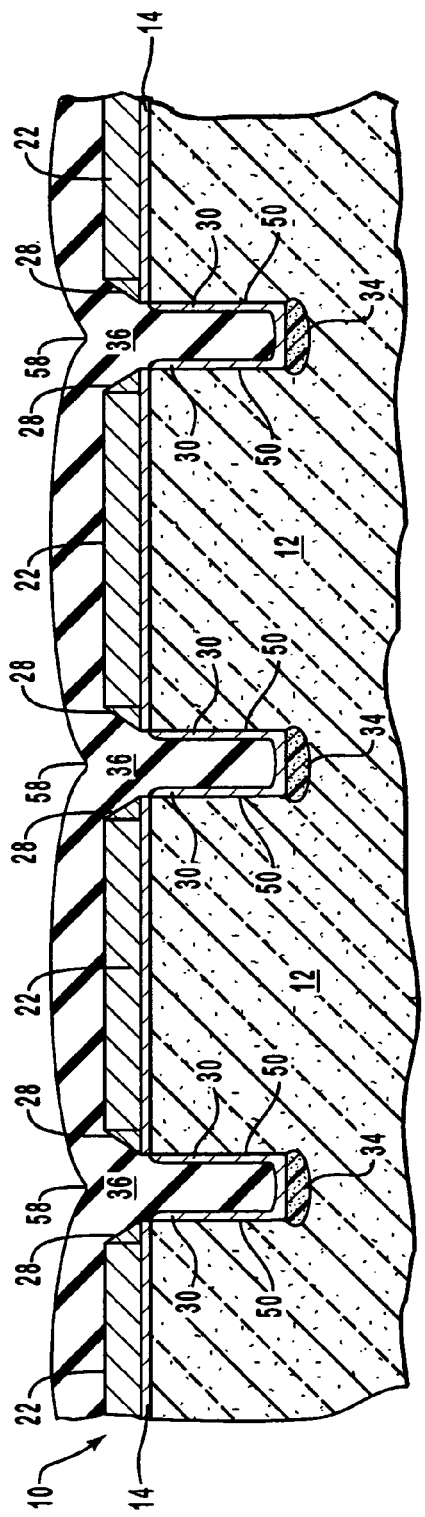
FIGS. 6A and 6B illustrate further processing of the structure structures depicted, respectively, in FIGS. 5A and 5B, in which an isolation film has been deposited over the spacer, the isolation trench within the isolation trench liner, and the nitride island.

As seen in FIG. 6A, isolation trench 32 is filled by an isolation film 36 which also is formed upon insulator island 22. Isolation film 36 can formed by a deposition process using, for example, TEOS as a precursor.

An optional processing step of the inventive method is to fuse together spacer 28, pad oxide 14, and isolation film 36. The processing technique for such fusion is preferably a heat treatment of semiconductor structure 10. If such fusion is contemplated, it is also desirable that spacer 28, pad oxide 14, and isolation film 36 all be composed of substantially the same material, as fusion is best facilitated with common materials.

It is preferable, at some point in fabrication of the isolation trench, to densify the fill material of the isolation trench. Densification is desirable because it helps to prevent separation of materials in contact with the fill material. As seen in FIG. 6A, densification will prevent isolation film 36 from separating at interfaces with spacer 28, pad oxide 14, and insulation liner 30. It is preferable to perform densification of isolation film 36 immediately following its deposition. Depending upon the specific application, however, densification may be carried out at other stages of the process. For example, densification of isolation film 36 by rapid thermal processing (RTP) may make either etchback or CMP more difficult. As such, it is preferable to densify later in the fabrication process, such as after planarizing or etchback processing.

Figure 7A:
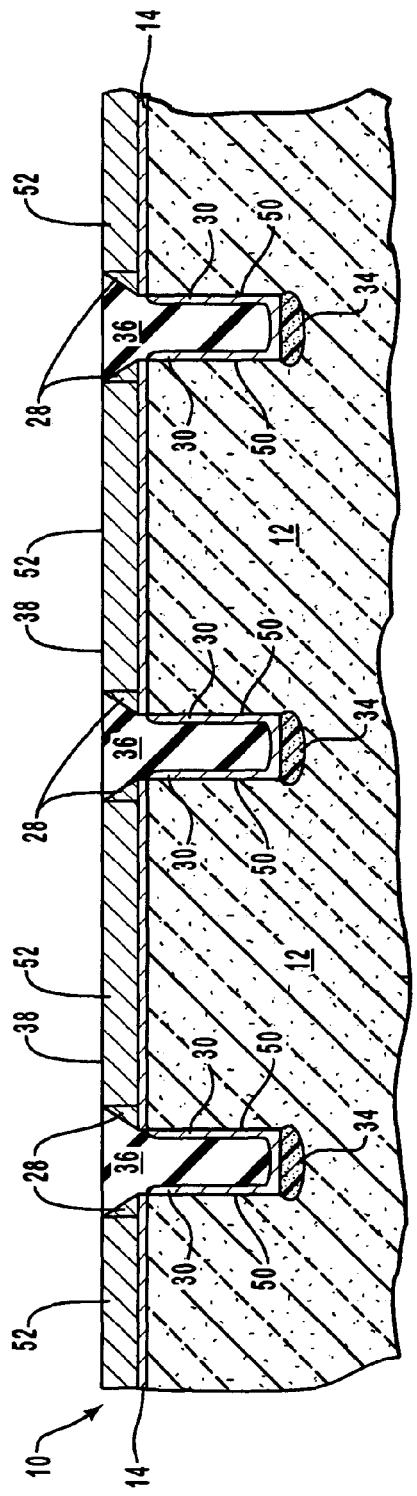
FIGS. 7A and 7B illustrate further processing of the structure structures depicted, respectively, in FIGS. 6A and 6B, wherein a planarization process has formed a first upper surface made up of the nitride island, the spacer, and the isolation film, all being substantially co-planar on the first upper surface.

FIG. 7A illustrates a subsequent step of formation of the isolation trench wherein insulator island 22, spacer 28, and isolation film 36 are planarized to form a common co-planar first upper surface 38. First upper surface 38 will preferably be formed by a CMP or etchback process. Preferably, planarization will remove isolation film 36 slightly faster than insulator island 22, such as by a factor of about one half. A first preferred selectivity of an etch recipe used in the inventive method is in the range of about 1:1 to 2:1, wherein isolation film 36 is removed faster as compared to insulator island 22. A more preferred selectivity is in the range of about 1.3:1 to about 1.7:1. A most preferred selectivity is about 1.5:1. Planarization also requires the etch recipe to remove spacer 28 slightly faster than insulator island 22. Preferably, spacer 28 and isolation film 36 are made from the same material such that the etch will be substantially uniform as to the selectivity thereof with respect to spacer 28 and isolation film 36 over insulator island 22.

First upper surface 38 is illustrated as being substantially planar in FIG. 7A. It will be appreciated by one of ordinary skill in the art that first upper surface 38 will form a nonplanar profile or topography depending upon the selectivity of the etch recipe or of the chemical used in a planarization technique such as CMP. For example, where reduced island 52 is formed from a nitride material and isolation film 36 is formed from an oxide material, first upper surface 38 would undulate as viewed in cross-section with more prominent structures being the result of an etch or planarization technique more selective thereto.

In FIG. 7A, reduced island 52 has been formed from insulator island 22. Additionally, portions of isolation film 36 and spacer 28 remain after planarization. Reduced island 52 preferably acts as a partial etch stop.

FIG. 8A illustrates the results of removal of reduced island 52. Reduced island 52 is preferably removed with an etch that is selective to isolation film 36 and spacer 28, leaving an isolation structure 48 that extends into and above isolation trench 32, forming a nail shaped structure having a head 54 extending above and away from isolation trench 32 upon an oxide layer 44. The future or current active area of semiconductor substrate 12, which may be at least partially covered over by head 54, is substantially prevented from a detrimental charge and current leakage by head 54.

Phantom lines 60 in FIG. 8A illustrate remnants of pad oxide layer 14, insulation liner 30, and spacer 28 as they are optionally thermally fused with isolation film 36 to form isolation structure 48. Isolation structure 48, illustrated in FIG. 8A, comprises a trench portion and a flange portion which together, when viewed in cross-section, form the shape of a nail.

The trench portion of isolation structure 48 is substantially composed of portions of isolation film 36 and insulation liner 30. The trench portion intersects the flange portion at a second upper surface 40 of semiconductor substrate 12 as seen in FIG. 8A. The trench portion also has two sidewalls 50. FIG. 8A shows that the trench portion is substantially parallel to a third upper surface 42 and sidewalls 50. The flange portion is integral with the trench portion and is substantially composed of portions of pad oxide 14, spacer 28, and isolation film 36. The flange portion has a lowest region at second upper surface 40 where the flange portion intersects the trench portion. The flange portion extends above second upper surface 40 to third upper surface 42 seen in FIG. 8A. Upper surfaces 40, 42 are substantially orthogonal to two flange sidewalls 64 and sidewall 50. The flange portion is substantially orthogonal in orientation to the trench portion. The flange portion may also include a gate oxide layer 44 after gate oxide layer 44 is grown.

Following formation of isolation structure 48, it is often useful to remove pad oxide 14, seen in FIG. 8A, due to contamination thereof during fabrication of isolation structure 48. Pad oxide 14 can become contaminated when it is used as an etch stop for removal of reduced island 52. For example, pad oxide 14 may be removed by using aqueous HF to expose second upper surface 40. A new oxide layer, gate oxide layer 44, may then be formed on second upper surface 40 having third upper surface 42.

Semiconductor structure 10 may be implanted with ions as illustrated by arrows seen in FIG. 8A. This implantation, done with N-doping materials in an N-well region, for example, is to enhance the electron conductivity of the active area (not shown) of semiconductor substrate 12. Either preceding or following removal of pad oxide 14 seen in FIG. 8A, an enhancement implantation into the active area of semiconductor substrate 12 may be carried out, whereby preferred doping ions are implanted on either side of isolation structure 48.

Ion implantation into semiconductor substrate 12 to form active areas, when carried out with isolation structure 48 in place, will cause an ion implantation concentration gradient to form in the region of semiconductor substrate 12 proximate to and including second upper surface 40. The gradient will form within semiconductor substrate 12 near second upper surface 40 and immediately beneath the flange sidewalls 64 as the flange portion of isolation structure 48 will partially shield semiconductor substrate 12 immediately therebeneath. Thus, an ion implant gradient will form and can be controlled in part by the portion of semiconductor substrate 12 that is covered by head 54.

Gate oxide layer 44 is formed upon second upper surface 40 after pad oxide 14 has been removed to form portions of third upper surface 42. The entirety of third upper surface 42 includes head 54 of isolation structure 48 as it extends above gate oxide layer 44.

In a variation of the first embodiment of the present invention, the structure illustrated in FIG. 6A is planarized by use of a single etchback process. The single etchback uses an etch recipe that has a different selectivity for insulator island 22 than for isolation film 36. In this alternative embodiment, spacer 28, isolation film 36, and pad oxide 14 are composed of substantially the same material. Insulator island 22 has a composition different from that of isolation film 36. For example, isolation film 36 and spacer 28 are composed of $SiO_2$, and insulator island 22 is composed of silicon nitride.

The etch recipe for the sin le etchback is chosen to be selective to isolation film 36 such that, as upper surface 58 of isolation film 36 recedes toward pad oxide 14 and eventually exposes insulator island 22 and spacer 28, insulator island 22 has a greater material removal rate than spacer 28 or isolation film 36. As such, a final isolation structure 48 illustrated in FIG. 9A is achieved. Pad oxide 14 acts as an etch stop for this etch recipe. A residual depression of isolation film 36 may appear centered over filled isolation trench 32. A depression would be created, centered above isolation trench 32, during the filling of isolation trench 32 with isolation film 36, as seen in FIG. 6A. Where a depression is not detrimental to the final isolation structure 48 as illustrated in FIG. 9A, this selective etch recipe alternative may be used.

Semiconductor structure 10, as illustrated in FIG. 9A, can be seen to have a substantially continuous isolation structure substantially covering semiconductor substrate 12. An upper surface 42a of isolation structure 48 includes the head portion or nail head 54. Semiconductor substrate 12 is covered at an upper surface 42b by either a pad oxide layer or a gate oxide layer. Another upper surface 42c comprises the upper surface of the pad oxide layer or gate oxide layer.

A starting structure for an example of a second embodiment of the present invention is illustrated in FIG. 2B. In FIG. 2B, pad oxide 14 is grown upon semiconductor substrate 12 and a polysilicon layer 18 is deposited upon pad oxide 14. This embodiment of the present invention parallels the processing steps of the first embodiment with the additional processing that takes into account the use of polysilicon layer 18.

Figure 3B:
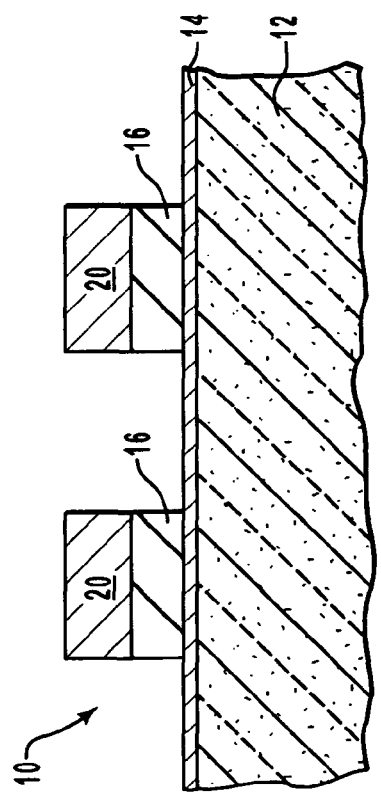
FIG. 3B illustrates further processing of the structure depicted in FIG. 2B, wherein a mask has been patterned and the nitride layer has been etched down through the nitride layer and the polysilicon layer to stop on the pad oxide layer, thereby forming a nitride island and a polysilicon island over future or current active areas in the substrate that are to be protected.

FIG. 3B illustrates etching through nitride layer 16 and polysilicon layer 18 to stop on pad oxide 14. The etch creates both an insulator island 22 and a polysilicon island 24 formed, respectively, from nitride layer 16 and polysilicon layer 18.

Figure 4B:
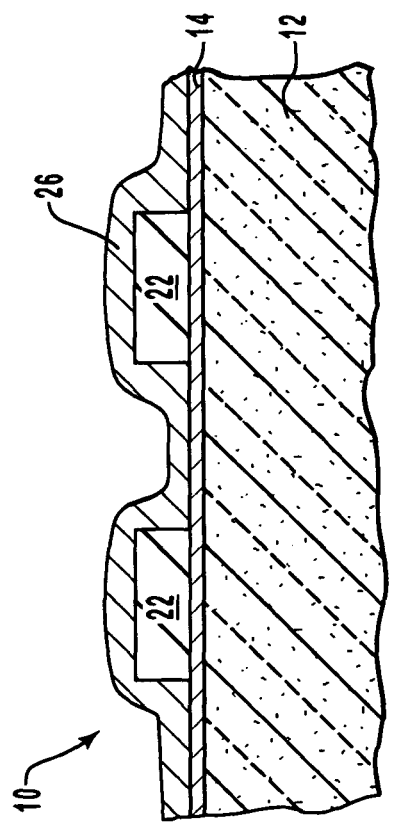
FIG. 4B illustrates further processing of the structure in FIG. 3B, wherein the mask has been removed and an insulation film has been deposited over the nitride island and the polysilicon island.

FIG. 4B illustrates further processing of the structure depicted in FIG. 3B, wherein insulation film 26 has been deposited upon insulator island 22, laterally exposed portions of polysilicon island 24, and exposed portions of pad oxide 14. Following deposition of insulation film 26, a spacer etch and an isolation trench etch are carried out similarly to the spacer etch and isolation trench etch carried out upon semiconductor structure 10 illustrated in FIG. 5A.

FIG. 5B illustrates the results of both the spacer etch and the isolation trench etch and optional implantation of isolation trench 32 to form trench bottom 34 analogous to doped trench bottom 34 illustrated in FIG. 5A. Formation of insulation liner 30 within isolation trench 32 preferentially precedes implantation to form P-doped trench bottom 34. Following optional implantation of doping ions, full or partial removal of spacer 28 may optionally be performed as set forth above with respect to the first embodiment of the invention.

Figure 6B:
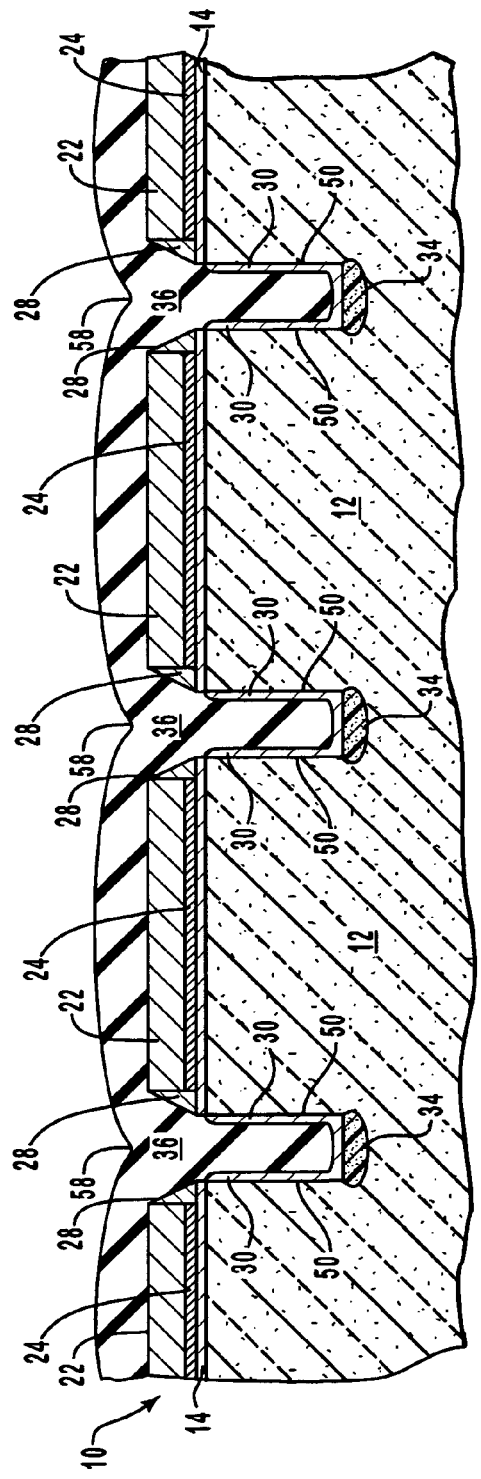

FIG. 6B illustrates a subsequent step in fabrication of an isolation trench according to the second embodiment of the inventive method, wherein isolation film 36 is deposited both within isolation trench 32, and over both of insulator island 22 and spacer 28. As set forth above, densification of isolation film 36 is a preferred step to be carried out either at this stage of fabrication or at a subsequent selective stage. Planarization or etchback of isolation film 36 is next carried out as set forth in the first embodiment of the present invention, and as illustrated in FIG. 7B.

Figure 7B:
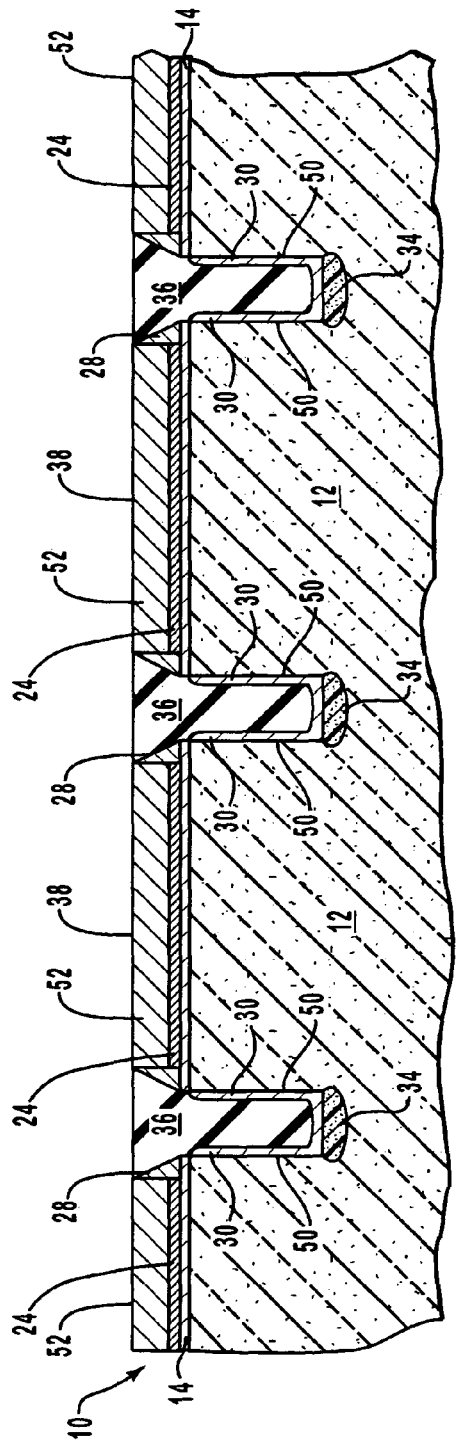

The process of planarization or etchback of isolation film 36 reduces insulator island 22 to form reduced island 52 as illustrated in FIG. 7B. Next, additional selective ion implantations can be made through polysilicon island 24 and into the active area of semiconductor substrate 12 that lies beneath polysilicon island 24.

In FIG. 8B, it can be seen in phantom that spacer 28 has a top surface that is co-planar with third upper surface 42 of isolation structure 48 after planarization. Polysilicon island 24 an spacer 28 are formed as shown in FIG. 8B. Removal of spacer 28 from the structures illustrated in FIG. 8B can be accomplished by patterning and etching with a mask that covers head 54 that extends above and away from isolation trench 32 seen in FIG. 8B. The etching process exposes a surface on semiconductor substrate 12 upon which a gate oxide layer is deposited or grown.

To form the structure seen in FIG. 9B, semiconductor structures 10 of FIGS. 7B or 8B are subjected to implantation of semiconductor substrate 12 with ions. Semiconductor structure 10 is then subjected to a heat treatment so as to fuse together isolation film 36, optional pad oxide 14, insulation liner 30, and spacer 28 into an integral filled isolation trench.

Subsequent to the process illustrated in FIGS. 6A-8A and 6B-9B a final thermal treatment, or subsequent thermal treatments, can be performed. Heat treatment may cause isolation structure 48 to be wider proximal to third upper surface 42 than proximal to doped trench bottom 34. When so shaped, an unoxidized portion of the active area of semiconductor substrate 12 that forms sidewall 50 would have a trapezoidal shape when viewed in cross-section, where the widest portion is second upper surface 40 and the narrowest portion is at doped trench bottom 34. Where a trapezoidal shape of the trench portion causes unwanted encroachment into the active area of semiconductor substrate 12, the optional formation of insulation liner 30 from a nitride material or equivalent is used to act as an oxidation barrier for sidewall 50. Semiconductor structure 10 is illustrated in FIG. 9B as being implanted by doping ions, as depicted with downwardly directed arrows. Following a preferred implantation, thermal processing may be carried out in order to achieve dopant diffusion near upper surface 42b of implanted ions residing within semiconductor substrate 12. Due to head 54 extending onto semiconductor substrate 12, a doping concentration gradient can be seen between the active area 53a and the active area 53b. The starting and stopping point of the doping concentration gradient in relation to flange sidewalls 64 will depend upon the duration and temperature of a thermal treatment.

The present invention may be carried out wherein spacer 28 and isolation film 36 are substantially composed of the same oxide material, and insulator island 22 is substantially composed of a nitride composition. Other compositions may be chosen wherein etch selectivity or CMP selectivity slightly favors insulator island 22 over both spacer 28 and isolation film 36. The specific selection of materials will depend upon the application during fabrication of the desired isolation trench.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming a microelectronic structure, the method comprising:
    forming an oxide layer upon a semiconductor substrate;
    forming a first dielectric layer upon the oxide layer;
    selectively removing the first dielectric layer to expose the oxide layer at a plurality of areas;
    forming a second dielectric layer over the oxide layer and the first dielectric layer, wherein the forming a second dielectric layer includes forming a second dielectric layer over and in contact with the exposed oxide layer at the plurality of areas;

selectively removing the second dielectric layer to form a plurality of spacers from the second dielectric layer, wherein each spacer is situated upon the oxide layer, is in contact with the first dielectric layer, and is adjacent to an area of the plurality of areas;

forming a plurality of isolation trenches extending below the oxide layer into the semiconductor substrate, wherein each isolation trench is adjacent to and below a pair of the spacers and is situated at a corresponding area of the plurality of areas, and wherein each isolation trench has a top edge;

forming a liner upon a sidewall of each isolation trench;

filling each isolation trench with a conformal layer, the conformal layer extending above the oxide layer in contact with a corresponding pair of the spacers, wherein the filling is performed by depositing the conformal layer, and the depositing is carried out to the extent of filling each isolation trench and extending over the spacers and over the first dielectric layer so as to define an upper surface contour of the conformal layer;

substantially simultaneously subjecting the entire upper surface contour of the conformal layer to a planarizing process and planarizing the conformal layer at least to the first dielectric layer and each spacer to form therefrom an upper surface for each isolation trench that is co-planar to the other upper surfaces; and fusing the oxide layer, liner, spacers and conformal layer; wherein the conformal layer comprises a material that is electrically insulative and extends continuously between and within the plurality of isolation trenches.

2. The method according to claim 1, wherein forming a liner upon a sidewall of each isolation trench comprises thermally growing oxide on the semiconductor substrate.

3. The method according to claim 1, wherein forming the liner upon the sidewall of the isolation trench comprises depositing a composition of matter.

4. The method according to claim 1, further comprising forming a doped region below the termination of each isolation trench within the semiconductor substrate.

5. The method according to claim 1, wherein the upper surface for each isolation trench is formed by chemical-mechanical planarization.

6. A method of forming a microelectronic structure, the method comprising:
   forming a first dielectric layer upon an oxide layer over a semiconductor substrate;
   selectively removing the first dielectric layer to expose the oxide layer at a plurality of areas;
   forming a second dielectric layer over the oxide layer and the first dielectric layer, wherein the forming a second dielectric layer includes forming a second dielectric layer on and in contact with the exposed oxide layer at the plurality of areas;
   selectively removing the second dielectric layer to form a plurality of spacers from the second dielectric layer, wherein each spacer is situated upon the oxide layer, is in contact with the first dielectric layer, and is adjacent to an area of the plurality of areas;
   forming a plurality of isolation trenches extending below the oxide layer into the semiconductor substrate, wherein each isolation trench is adjacent to and below a pair of the spacers and is situated at a corresponding area of the plurality of areas, and wherein each isolation trench has an edge;
   rounding a top edge of each of the plurality of isolation trenches;
   filling each isolation trench with a conformal layer, the conformal layer extending above the oxide layer in contact with a corresponding pair of the spacers, wherein filling is performed by depositing the conformal layer and depositing is carried out to the extent of filling each isolation trench and extending over the spacers and over the first dielectric layer so as to define an upper surface contour of the conformal layer;
   substantially simultaneously subjecting an entire upper surface contour of the conformal layer to a planarizing process and planarizing the conformal layer to form therefrom an upper surface for each isolation trench that is co-planar to the other upper surfaces; and
   fusing the oxide layer, spacers and conformal layer;
   wherein:
      the conformal layer comprises a material that is electrically insulative and extends continuously between and within the plurality of isolation trenches;
      the conformal layer and the spacers form the upper surface for each isolation trench, each upper surface being formed from the conformal layer and the spacers and being situated above the oxide layer; and
      the first dielectric layer is in contact with at least a pair of the spacers and the oxide layer.

7. The method according to claim 6, further comprising: forming a gate oxide upon the semiconductor substrate.

8. The method according to claim 6, wherein removing portions of the conformal material comprises etching the material using an etch recipe that etches the conformal material faster than the first dielectric material by a ratio in a range from about 1:1 to about 2:1.

9. The method according to claim 8, wherein etching the material using an etch recipe that etches the conformal material faster than the first dielectric material by a ratio in a range from about 1:1 to about 2:1 comprises etching the conformal material the ratio is in a range from about 1.3:1 to about 1.7:1.

10. The method according to claim 6, wherein removing portions of the conformal material overlying the remaining portions of the oxide comprises:
   chemical mechanical planarization, wherein the conformal material, the spacers, and the first dielectric material form a planar first upper surface; and
   etching to form a second upper surface situated above the oxide.

11. The method according to claim 6, wherein removing portions of the conformal material that overlie the remaining portions of the oxide further comprises etching using an etch recipe that etches the conformal material faster than the first dielectric material by a ratio in a range of from about 1:1 to about 2:1.

12. The method according to claim 11, wherein etching using an etch recipe that etches the conformal material faster than the first dielectric material by a ratio in a range from about 1:1 to about 2:1 comprises etching using an etch recipe that etches the conformal material faster than the first dielectric material by a ratio in a range of from about 1.3:1 to about 1.7:1.

13. A method of forming a microelectronic structure, the method comprising:
   forming an oxide layer upon a semiconductor substrate;
   forming a silicon nitride layer upon the oxide layer;
   selectively removing the silicon nitride layer to expose the oxide layer at a plurality of areas;
   forming a first silicon dioxide layer over the oxide layer and over the silicon nitride layer, wherein forming a first silicon dioxide layer includes forming a first silicon dioxide layer on and in contact with the exposed oxide layer at the plurality of areas;

selectively removing the first silicon dioxide layer to form a plurality of spacers from the first silicon dioxide layer, wherein each spacer is situated upon the oxide layer, is in contact with the silicon nitride layer, and is adjacent to an area of the plurality of areas;

forming a plurality of isolation trenches extending below the oxide layer into and terminating within the semiconductor substrate, wherein each isolation trench is adjacent to and below a pair of the spacers and is situated at a corresponding area of the plurality of areas, and wherein each isolation trench has a top edge;

forming a corresponding electrically active region below the termination of each isolation trench within the semiconductor substrate;

forming a liner upon a sidewall of each isolation trench, the liner being confined preferentially within each isolation trench and extending from an interface thereof with the oxide layer to the termination of the isolation trench within the semiconductor substrate;

filling each isolation trench with a conformal second silicon dioxide layer, the conformal second silicon dioxide layer within each isolation trench extending above the oxide layer in contact with the corresponding pair of the spacers, wherein filling is performed by depositing the conformal second silicon dioxide layer, and depositing is carried out to the extent of filling each isolation trench and extending over the spacers and the silicon nitride layer so as to define an upper surface contour of the conformal second silicon dioxide layer;

substantially simultaneously subjecting an entire upper surface contour of the conformal second silicon dioxide layer to a planarizing process so as to remove the conformal second silicon dioxide layer and the spacers to form an upper surface for each isolation trench that is co-planar to the other upper surfaces and being situated above the oxide layer, wherein a material that is electrically insulative extends continuously between and within the plurality of isolation trenches; and fusing the oxide layer, liner, spacers and conformal second silicon dioxide layer.

14. The method according to claim 13, wherein forming a liner upon a sidewall of each isolation trench comprises forming a thermally grown oxide upon a sidewall of the semiconductor substrate.

15. The method according to claim 13, wherein forming a liner upon a sidewall of each isolation trench comprises forming a liner composed of silicon nitride.

16. The method according to claim 14, further comprising: forming a gate oxide upon the semiconductor substrate.

17. A method of forming a microelectronic structure, the method comprising:

forming an oxide layer upon a semiconductor substrate;
forming a polysilicon layer upon the oxide layer;
forming a first dielectric layer upon the polysilicon layer;
selectively removing the first dielectric layer and the polysilicon layer to expose the oxide layer at a plurality of areas;

forming a second dielectric layer conformally over the oxide layer, the polysilicon layer, and the first dielectric layer, wherein the forming a second dielectric layer includes forming a second dielectric layer on and in contact with the exposed oxide layer at the plurality of areas;

selectively removing the second dielectric layer to form a plurality of spacers from the second dielectric layer, wherein each spacer is upon the oxide layer, is in contact with both the polysilicon layer and the first dielectric layer, and is adjacent to an area of the plurality of areas;

forming a plurality of isolation trenches extending below the oxide layer and from top edges into and terminating within the semiconductor substrate, wherein each isolation trench is adjacent to and below a pair of the spacers and is situated at a corresponding area of the plurality of areas;

rounding the top edges of each of the isolation trenches;

filling each isolation trench with a conformal third layer, the conformal third layer extending above the oxide layer in contact with a corresponding pair of the spacers, wherein filling is performed by depositing the conformal third layer, and depositing is carried out to the extent of filling each isolation trench and extending over the spacers and over the first dielectric layer so as to define an upper surface contour of the conformal third layer;

substantially simultaneously subjecting an entire upper surface contour of the conformal third layer to a planarizing process and planarizing the conformal third layer to form therefrom an upper surface for each isolation trench that is co-planar to the other upper surfaces; and fusing the oxide layer, spacers and conformal third layer;

wherein a material that is electrically insulative extends continuously between and within the plurality of isolation trenches; and wherein the microelectronic structure is defined at least in part by the plurality of spacers, the conformal third layer, and the plurality of isolation trenches.

18. The method according to claim 17, wherein the upper surface for each isolation trench is formed by chemical-mechanical planarization.

19. The method according to claim 17, wherein implanting comprises forming a doped region below the termination of each isolation trench within the semiconductor substrate.

20. The method according to claim 17, wherein rounding the top edges of each of the isolation trenches comprises forming a liner upon a sidewall of each isolation trench, the liner being confined preferentially within each isolation trench and extending from an interface thereof with the oxide to the termination of the isolation trench within the semiconductor substrate, and wherein the conformal third material is electrically insulative.

21. The method according to claim 20, wherein forming a liner upon a sidewall of each isolation trench comprises forming a thermally grown oxide upon a sidewall the semiconductor substrate.

22. A method of forming a microelectronic structure, the method comprising:

forming an oxide layer upon a semiconductor substrate;
forming a polysilicon layer upon the oxide layer;
forming a first dielectric layer upon the polysilicon layer;
selectively removing the first dielectric layer and the polysilicon layer to expose the oxide layer at a plurality of areas;

forming a second dielectric layer conformally over the oxide layer, the polysilicon layer, and the first dielectric layer, wherein forming a second dielectric layer includes forming a second dielectric layer on and in contact with the exposed oxide layer at the plurality of areas;

selectively removing the second dielectric layer to form a plurality of spacers from the second dielectric layer, wherein each spacer is upon the oxide layer, is in contact with both the polysilicon layer and the first dielectric layer, and is adjacent to an area of the plurality of areas;

forming a plurality of isolation trenches extending below the oxide layer and from top edges into and terminating within the semiconductor substrate, wherein each isolation trench of the plurality of isolation trenches is adjacent to and below a pair of the spacers and is situated at a corresponding area of the plurality of areas;

rounding the top edges of each isolation trench of the plurality of isolation trenches;

filling each isolation trench of the plurality of isolation trenches with a conformal third layer, the conformal third layer extending above the oxide layer in contact with a corresponding pair of the spacers, wherein filling is performed by depositing the conformal third layer, and depositing is carried out to the extent of filling each isolation trench and extending over the spacers and over the first dielectric layer so as to define an upper surface contour of the conformal third layer;

substantially simultaneously subjecting an entire upper surface contour of the conformal third layer to a planarizing process and planarizing the conformal third layer to form therefrom an upper surface for each isolation trench of the plurality of isolation trenches that is co-planar to the other upper surfaces; and fusing the oxide layer, spacers and conformal third layer;

wherein the conformal third layer is an electrically insulative material that extends continuously between and within the plurality of isolation trenches;

wherein the upper surface for each isolation trench of the plurality of isolation trenches is formed from the conformal third layer, the spacers, and the first dielectric layer; and wherein the microelectronic structure is defined at least in part by the plurality of spacers, the conformal third layer, and the plurality of isolation trenches.

23. A method of forming a microelectronic structure, the method comprising:

forming an oxide layer upon a semiconductor substrate;
forming a polysilicon layer upon the oxide layer;
forming a first dielectric layer upon the polysilicon layer;
selectively removing the first dielectric layer and the polysilicon layer to expose the oxide layer at a plurality of areas;

forming a second dielectric layer conformally over the oxide layer, the polysilicon layer, and the first dielectric layer, wherein the forming a second dielectric layer includes forming a second dielectric layer on and in contact with the exposed oxide layer at the plurality of areas;

selectively removing the second dielectric layer to form a plurality of spacers from the second dielectric layer, wherein each spacer of the plurality of spacers is upon the oxide layer, is in contact with both the polysilicon layer and the first dielectric layer, and is adjacent to an area of the plurality of areas;

forming a plurality of isolation trenches extending below the oxide layer and from top edges into and terminating within the semiconductor substrate, wherein each isolation trench of the plurality of isolation trenches is adjacent to and below a pair of the spacers and is situated at a corresponding area of the plurality of areas;

rounding the top edges of each of the isolation trenches;
filling each isolation trench with a conformal third layer, the conformal third layer extending above the oxide layer in contact with a corresponding pair of the spacers, wherein filling is performed by depositing the conformal third layer, and depositing is carried out to the extent of filling each isolation trench and extending over the spacers and over the first dielectric layer so as to define an upper surface contour of the conformal third layer;

substantially simultaneously subjecting an entire upper surface contour of the conformal third layer to a planarizing process and planarizing the conformal third layer to form therefrom an upper surface for each isolation trench that is co-planar to the other upper surfaces;

exposing the oxide layer upon a portion of a surface of the semiconductor substrate;

forming a gate oxide layer upon the portion of the surface of the semiconductor substrate;

forming between the plurality of isolation trenches, and confined in the space therebetween, a layer composed of polysilicon upon the oxide layer in contact with a pair of the spacers;

selectively removing the third layer, the spacers, and the layer composed of polysilicon to form a portion of at least one of the upper surfaces; and fusing the oxide layer, spacers and conformal third layer;
wherein a material that is electrically insulative extends continuously between and within the plurality of isolation trenches.

24. A method of forming a microelectronic structure, the method comprising:

forming an oxide layer upon a semiconductor substrate;
forming a polysilicon layer upon the oxide layer;
forming a first dielectric layer upon the polysilicon layer;
selectively removing the first dielectric layer and the polysilicon layer to expose the oxide layer at a plurality of areas;

forming a second dielectric layer conformally over the oxide layer, the polysilicon layer, and the first dielectric layer, wherein the forming a second dielectric layer includes forming a second dielectric layer on and in contact with the exposed oxide layer at the plurality of areas;

selectively removing the second dielectric layer to form a plurality of spacers from the second dielectric layer, wherein each spacer of the plurality of spacers is upon the oxide layer, is in contact with both the polysilicon layer and the first dielectric layer, and is adjacent to an area of the plurality of areas;

forming a plurality of isolation trenches extending below the oxide layer and from top edges into and terminating within the semiconductor substrate, wherein each isolation trench of the plurality of isolation trenches is adjacent to and below a pair of the spacers and is situated at a corresponding area of the plurality of areas;

rounding the top edges of each isolation trench of the plurality of isolation trenches;

filling each isolation trench with a conformal third layer, the conformal third layer extending above the oxide layer in contact with a corresponding pair of the spacers, wherein filling is performed by depositing the conformal third layer, and depositing is carried out to the extent of filling each isolation trench and extending over the spacers and over the first dielectric layer so as to define an upper surface contour of the conformal third layer;

substantially simultaneously subjecting an entire upper surface contour of the conformal third layer to a planarizing process comprising an etch recipe that etches the conformal third layer and the spacers faster than the first dielectric by a ratio in a range from about 1:1 to about 2:1 and planarizing the conformal third layer to form therefrom an upper surface for each isolation trench that is co-planar to the other upper surfaces; and fusing the oxide layer, spacers and conformal third layer;

wherein a material that is electrically insulative extends continuously between and within the plurality of isolation trenches; and wherein the microelectronic structure is defined at least in part by the plurality of spacers, the conformal third layer, and the plurality of isolation trenches. corresponding pair of the spacers, wherein depositing is carried out to the extent of filling each isolation trench and extending over the spacers and over the first dielectric material so as to define an upper surface contour of the conformal third material;

25. The method according to claim 24, wherein the ratio is in a range from about 1.3:1 to about 1.7:1.

26. A method of forming a microelectronic structure, the method comprising:

forming a pad oxide layer upon a semiconductor substrate;

forming a polysilicon layer upon the pad oxide layer;

forming a silicon nitride layer upon the polysilicon layer;

selectively removing the silicon nitride layer and the polysilicon layer to expose the pad oxide layer at a plurality of areas;

forming a first silicon dioxide layer over the pad oxide layer and over the silicon nitride layer, wherein the forming a first silicon dioxide layer includes forming a first silicon dioxide layer on and in contact with the exposed pad oxide layer at the plurality of areas;

selectively removing the first silicon dioxide layer to form a plurality of spacers from the first silicon dioxide layer, wherein each spacer of the plurality of spacers is situated upon the pad oxide layer, is in contact with the silicon nitride layer and the polysilicon layer, and is adjacent to an area of the plurality of areas;

forming a plurality of isolation trenches extending below the pad oxide layer and from top edges into and terminating within the semiconductor substrate, wherein each isolation trench of the plurality of isolation trenches is adjacent to and below a pair of the spacers and is situated at a corresponding area of the plurality of areas;

forming a corresponding doped region below the termination of each isolation trench within the semiconductor substrate;

forming a liner upon a sidewall of each isolation trench, each liner extending from an interface thereof with the pad oxide layer to the termination of the isolation trench within the semiconductor substrate;

rounding the top edges of the isolation trenches;

filling each isolation trench with a conformal second layer, the conformal second layer extending above the pad oxide layer in contact with a corresponding pair of the spacers, wherein filling is performed by depositing the conformal second layer, and depositing is carried out to the extent of filling each isolation trench and extending over the spacers and over the silicon nitride layer so as to define an upper surface contour of the conformal second layer;

substantially simultaneously subjecting an entire upper surface contour of the conformal second layer to a planarizing process and planarizing the conformal second layer and each of the spacers to form therefrom an upper surface for each isolation trench that is co-planar to the other upper surfaces and is situated above the pad oxide layer; and fusing the pad oxide layer, liner, spacers and conformal second layer;

wherein a material that is electrically insulative extends continuously between and within the plurality of isolation trenches.

27. The method according to claim 26, wherein each liner is a thermally grown oxide of the semiconductor substrate, and wherein the conformal second material is electrically insulative.

28. The method according to claim 26, wherein each liner is composed of silicon nitride, and wherein the conformal second material is electrically insulative.

29. The method according to claim 26, further comprising:

exposing the pad layer upon a portion of a surface of the semiconductor substrate;

forming a gate oxide layer upon the portion of the surface of the semiconductor substrate;

forming between the plurality of isolation trenches, and confined in a space therebetween, a layer composed of polysilicon upon the gate oxide layer in contact with a pair of the spacers, and selectively removing the layer composed of polysilicon to form a portion of at least one of the upper surfaces.

30. A method for forming a microelectronic structure, the method comprising:

providing a semiconductor substrate having a top surface with an oxide layer thereon;

forming a polysilicon layer upon the oxide layer;

forming a first layer upon the polysilicon layer;

selectively removing the first layer and the polysilicon layer to expose the oxide layer at a plurality of areas;

forming a plurality of isolation trenches through the exposed oxide layer at the plurality of areas, wherein an electrically insulative material extends continuously between and within the plurality of isolation trenches, each isolation trench:

having a spacer composed of a dielectric material upon the oxide layer in contact with the first layer and the polysilicon layer;

extending from an opening thereto at the top surface of the semiconductor substrate and below the oxide layer into and terminating within the semiconductor substrate adjacent to and below the spacer;

having a second layer filling the isolation trench and extending above the oxide layer in contact with the spacer, wherein filling is performed by depositing the second layer, and depositing is carried out to the extent of filling each isolation trench and extending over the spacer and over the first layer so as to define an upper surface contour of the second layer; and having a planar upper surface formed from the second layer and the spacer and being situated above the oxide layer, wherein the planar upper surface is formed by substantially simultaneously subjecting an entire upper surface contour of the second layer to a planarizing process; and fusing the oxide layer, spacer and second layer;

wherein the microelectronic structure is defined at least in part by a plurality of spacers, the second layer, and the plurality of isolation trenches.

31. The method as defined in claim 30, further comprising:

doping the semiconductor substrate with a dopant having a first conductivity type; and doping the semiconductor substrate below each isolation trench with a dopant having a second conductivity type opposite the first conductivity type to form a doped trench bottom that is below and in contact with a respective one isolation trench of the plurality of isolation trenches.

32. The method according to claim 31, wherein the doped trench bottom has a width, each isolation trench has a width, and the width of each doped trench bottom is greater than the width of the respective isolation trench.

33. A method for forming a microelectronic structure, the method comprising:
providing a semiconductor substrate having a top surface with an oxide layer thereon;
forming a first layer upon the oxide layer;
selectively removing the first layer to expose the oxide layer at a plurality of areas;
forming a plurality of isolation trenches through the oxide layer at the plurality of areas, wherein an electrically insulative material extends continuously between and within the plurality of isolation trenches without filling the plurality of isolation trenches, each isolation trench:
having a spacer composed of a dielectric material upon the oxide layer in contact with the first layer;
extending from an opening thereto at the top surface of the semiconductor substrate and below the oxide layer into and terminating within the semiconductor substrate adjacent to and below the spacer;
having a second layer filling the isolation trench and extending above the oxide layer in contact with the spacer, wherein filling is performed by depositing the second layer, and the depositing is carried out to the extent of filling each isolation trench and extending over the spacer and over the first layer so as to define an upper surface contour of the second layer; and
having a planar upper surface formed from the second layer and the spacer and being situated above the oxide layer, wherein the planar upper surface is formed by substantially simultaneously subjecting an entire upper surface contour of the second layer to a planarizing process; and
fusing the oxide layer, electrically insulative material, spacer and second layer;
wherein the microelectronic structure is defined at least in part by the plurality of spacers, the second layer, and the plurality of isolation trenches.

34. The method according to claim 33, further comprising:
doping the semiconductor substrate with a dopant having a first conductivity type;
and wherein implanting ions in the plurality of isolation trenches in a direction substantially orthogonal to a plane of the oxide further comprises:
doping the semiconductor substrate below each isolation trench with a dopant having a second conductivity type opposite the first conductivity type to form a doped trench bottom that is below and in contact with a respective one of the isolation trenches.

35. The method of claim 34, wherein:
the doped trench bottom has a width;
each isolation trench has a width; and
the width of each doped trench bottom is greater than the width of the respective isolation trench.

36. A method for forming a microelectronic structure, the method comprising:
providing a semiconductor substrate having a top surface with an oxide layer thereon;
forming a polysilicon layer upon the oxide layer;
forming a first layer upon the polysilicon layer;
forming a first isolation structure including:
a first spacer composed of a dielectric material upon the oxide layer in contact with the first layer and the polysilicon layer;
a first isolation trench extending from an opening thereto at top edges at the top surface of the semiconductor substrate and below the oxide layer into and terminating within the semiconductor substrate adjacent to and below the first spacer, wherein the first spacer is situated on a side of the first isolation trench, and wherein the first isolation trench has a top edge that is rounded; and
a second spacer composed of a dielectric material upon the oxide layer in contact with the first layer and the polysilicon layer, the second spacer being situated on a side of the first isolation trench opposite the side of the first spacer;
forming a second isolation structure including:
a first spacer composed of a dielectric material upon the oxide layer in contact with the first layer and the polysilicon layer;
a first isolation trench extending from an opening thereto at top edges at the top surface of the semiconductor substrate and below the oxide layer into and terminating within the semiconductor substrate adjacent to and below the first spacer of the second isolation structure, wherein the first spacer of the second isolation structure is situated on a side of the first isolation trench, and wherein the first isolation trench in the second isolation structure has a top edge that is curved; and
a second spacer composed of a dielectric material upon the oxide layer in contact with the first layer and the polysilicon layer, the second spacer of the second isolation structure being situated on a side of the first isolation trench opposite the side of the first spacer of the second isolation structure;
rounding the top edges of the isolation trenches;
forming an active area located within the semiconductor substrate between the first and second isolation structures;
forming a conformal second layer, composed of an electrically insulative material, filling the first and second isolation trenches and extending continuously therebetween and above the oxide layer in contact with the first and second spacers of the respective first and second isolation structures, wherein filling is performed by depositing the conformal second layer, and depositing is carried out to an extent of filling each of the isolation trenches and extending over the spacers and over the first layer so as to define an upper surface contour of the conformal second layer;
substantially simultaneously subjecting an entire upper surface contour of the second layer to a planarizing process;
forming a planar upper surface from the conformal second layer and the first and second spacers of the respective first and second isolation structures, and being situated above the oxide layer; and
fusing the oxide layer, first spacer, second spacer and conformal second layer of the first isolation structure and fusing the oxide layer, first spacer, second spacer and conformal second layer of the second isolation structure;
wherein the microelectronic structure is defined at least in part by the active area, the second layer, and the first and second isolation trenches.

37. A method for forming a microelectronic structure, the method comprising:
providing a semiconductor substrate having a top surface with an oxide layer thereon;
forming a first layer upon the oxide layer;
forming a first isolation structure including:
a first spacer composed of a dielectric material upon the oxide layer in contact with the first layer;

a first isolation trench extending from an opening thereto at the top surface of the semiconductor substrate and below the oxide layer into and terminating within the semiconductor substrate adjacent to and below the first spacer, wherein the first spacer is situated on a side of the first isolation trench, and wherein the first isolation trench has a top edge that is rounded; and a second spacer composed of a dielectric material upon the oxide layer in contact with the first layer, the second spacer being situated on a side of the first isolation trench opposite the side of the first spacer;

forming a second isolation structure including:

a first spacer composed of a dielectric material upon the oxide layer in contact with the first layer;

a first isolation trench extending below the oxide layer into and terminating within the semiconductor substrate adjacent to and below the first spacer of the second isolation structure, wherein the first spacer of the second isolation structure is situated on a side of the first isolation trench, and wherein the first isolation trench in the second isolation structure has a top edge that is rounded; and a second spacer composed of a dielectric material upon the oxide layer in contact with the first layer, the second spacer of the second isolation structure being situated on a side of the first isolation trench opposite the side of the first spacer of the second isolation structure;

forming an active area located within the semiconductor substrate between the first and second isolation structures;

forming a conformal second layer composed of an electrically insulative material, conformally filling the first and second isolation trenches and extending continuously therebetween and above the oxide layer in contact with the first and second spacers of the respective first and second isolation structures, wherein filling is performed by depositing the conformal second layer, and depositing is carried out to the extent of filling each of the isolation trenches and extending over the spacers and over the first layer so as to define an upper surface contour of the conformal second layer;

substantially simultaneously subjecting an entire upper surface contour of the second layer to a planarizing process and planarizing the conformal second layer and the first and second spacers of the respective first and second isolation structures to form a planar upper surface from the conformal second layer and the first and second spacers of the respective first and second isolation structures, and being situated above the oxide layer, wherein the microelectronic structure is defined at least in part by the active area, the conformal second layer, and the first and second isolation trenches; and fusing the oxide layer, first spacer, second spacer and conformal second layer of the first isolation structure and fusing the oxide layer, first spacer, second spacer and conformal second layer of the second isolation structure.

* * * * *

UNITED STATES PATENT AND TRADEMARK OFFICE
CERTIFICATE OF CORRECTION

PATENT NO. : 7,749,860 B2  Page 1 of 20
APPLICATION NO. : 09/392034
DATED : July 6, 2010
INVENTOR(S) : Fernando Gonzalez, David Chapek and Ranshir P. S. Thakur It is certified that error appears in the above-identified patent and that said Letters Patent is hereby corrected as shown below:

On the title page:
In Item (54), change "METHOD FOR FORMING A SELF-ALIGNED T-SHAPED ISOLATION TRENCH" to --METHOD FOR FORMING A SELF-ALIGNED ISOLATION TRENCH--

In the specification:
COLUMN 1, LINE 2, delete "T-SHAPED"

In the claims:

| | | | |
|---|---|---|---|
| CLAIM 1, | COLUMN 10, | LINE 59, | after "forming" insert --a first dielectric material upon-- and change "layer upon" to --over-- |
| CLAIM 1, | COLUMN 10, | LINE 60, | delete "forming a first dielectric layer upon the oxide layer;" |
| CLAIM 1, | COLUMN 10, | LINE 61, | change "layer" to --material-- and after "expose" insert --a plurality of areas of-- |
| CLAIM 1, | COLUMN 10, | LINE 62, | after "oxide" delete "layer at a plurality of areas" |
| CLAIM 1, | COLUMN 10, | LINE 63, | change "layer over the oxide layer and" to --material over-- |
| CLAIM 1, | COLUMN 10, | LINES 64-66, | after "the first dielectric" delete "layer, wherein the forming a second dielectric layer includes forming a second dielectric layer over" and insert --material-- therefor |
| CLAIM 1, | COLUMN 10, | LINE 66, | after "with the" insert --plurality of--, after "exposed" insert --areas of the-- and after "oxide" delete "layer at" |
| CLAIM 1, | COLUMN 10, | LINE 67, | delete "the plurality of areas" |
| CLAIM 1, | COLUMN 11, | LINE 1, | change "layer" to --material-- |
| CLAIM 1, | COLUMN 11, | LINE 2, | change "from the second dielectric layer," to --at peripheral edges of the plurality of exposed areas of-- |
| CLAIM 1, | COLUMN 11, | LINE 3, | delete "wherein each spacer is situated upon" and delete "layer, is" |

Signed and Sealed this

Sixteenth Day of November, 2010

David J. Kappos
*Director of the United States Patent and Trademark Office*

CERTIFICATE OF CORRECTION (continued)
U.S. Pat. No. 7,749,860 B2

In the claims (continued):

| | | | |
|---|---|---|---|
| CLAIM 1, | COLUMN 11, | LINES 4-5, | after "contact with" insert --lateral edges of-- and delete "layer, and is adjacent to an area of the plurality of areas" and insert --material-- therefor |
| CLAIM 1, | COLUMN 11, | LINES 6-11, | change "forming a plurality of isolation trenches extending below the oxide layer into the semiconductor substrate, wherein each isolation trench is adjacent to and below a pair of the spacers and is situated at a corresponding area of the plurality of areas, and wherein each isolation trench has a top edge;" to --removing a portion of material from the plurality of areas of the oxide at locations between adjacent portions of the plurality of spacers to form a plurality of isolation trenches extending into the semiconductor substrate;-- |
| CLAIM 1, | COLUMN 11, | LINE 12, | change "trench;" to --trench of the plurality of isolation trenches;-- |
| CLAIM 1, | COLUMN 11, | LINE 13, | delete "filling each isolation trench with" and insert therefor --implanting ions in the plurality of isolation trenches in a direction substantially orthogonal to a plane of the oxide;--, then insert --depositing-- before "a conformal," and change "layer" to --material in each isolation trench,-- |
| CLAIM 1, | COLUMN 11, | LINE 14, | change "conformal layer" to --conformal material-- and change "above the oxide layer" to --over remaining portions of the oxide-- |
| CLAIM 1, | COLUMN 11, | LINE 16, | change "filling" to --depositing-- and after "performed" delete "by depositing the conformal layer," |
| CLAIM 1, | COLUMN 11, | LINE 17, | delete "and the depositing is carried out" |
| CLAIM 1, | COLUMN 11, | LINE 19, | change "layer" to --material-- |
| CLAIM 1, | COLUMN 11, | LINE 20, | change "layer;" to --material;-- |
| CLAIM 1, | COLUMN 11, | LINES 21-23, | change "substantially simultaneously subjecting the entire upper surface contour of" to --removing portions of--, change "layer to a planarizing process and" to --material overlying the remaining portions of the oxide by--, and change "layer" to --material-- |
| CLAIM 1, | COLUMN 11, | LINES 24-25, | change "layer" to --material--, change "to form therefrom" to --such that--, and change "that is" to --is-- |
| CLAIM 1, | COLUMN 11, | LINES 26-28, | change "surfaces; and" to --surfaces,--, delete the paragraph break, delete "fusing the oxide layer, liner, spacers, and conformal layer; wherein," and change "layer comprises" to --material comprising-- |

CERTIFICATE OF CORRECTION (continued)
U.S. Pat. No. 7,749,860 B2

In the claims (continued):

| | | | |
|---|---|---|---|
| CLAIM 1, | COLUMN 11, | LINE 30, | change "trenches." to --trenches; and--, insert a paragraph break and then insert --removing the first dielectric material and portions of the oxide underlying the first dielectric material such that the conformal material fills each said isolation trench, extends horizontally away from each said isolation trench upon remaining portions of the oxide and sidewalls of the conformal material start on an upper surface of the semiconductor substrate and are substantially orthogonal to the upper surface contour of the conformal material.-- |
| CLAIM 4, | COLUMN 11, | LINE 37, | change "further comprising" to --wherein implanting ions in the plurality of isolation trenches in a direction substantially orthogonal to a plane of the oxide comprises-- |
| CLAIM 4, | COLUMN 11, | LINE 38, | after "each" insert --of said plurality of-- |
| CLAIM 4, | COLUMN 11, | LINE 39, | change "trench" to --trenches-- |
| CLAIM 4, | COLUMN 11, | LINES 40-41, | change "the upper surface for each isolation trench is formed" to --removing portions of the conformal material overlying the remaining portions of the oxide comprises removing portions of the conformal material overlying the remaining portions of the oxide-- |
| CLAIM 6, | COLUMN 11, | LINE 45, | change "dielectric layer" to --dielectric material-- and change "oxide layer" to --oxide-- |
| CLAIM 6, | COLUMN 11, | LINE 47, | change "dielectric layer" to --dielectric material-- and after "expose" insert --a plurality of areas of-- |
| CLAIM 6, | COLUMN 11, | LINE 48, | after "oxide" delete "layer at a plurality of areas" |
| CLAIM 6, | COLUMN 11, | LINE 49, | change "dielectric layer" to --dielectric material-- and after "over" delete "the oxide layer and" |
| CLAIM 6, | COLUMN 11, | LINES 50-53, | change "layer, wherein the forming a second dielectric layer includes forming a second dielectric layer on" to --material--, change "exposed oxide layer at the plurality of" to --plurality of exposed-- and after "areas" insert --of the oxide-- |
| CLAIM 6, | COLUMN 11, | LINE 54, | change "dielectric layer" to --dielectric material-- |
| CLAIM 6, | COLUMN 11, | LINE 55, | change "from the second dielectric layer," to --at peripheral edges of the plurality of exposed areas of-- |
| CLAIM 6, | COLUMN 11, | LINE 56, | delete "wherein each spacer is situated upon" and delete "layer, is" |
| CLAIM 6, | COLUMN 11, | LINES 57-58, | after "with" insert --lateral edges of-- and change "layer, and is adjacent to an area of the plurality of areas;" to --material;-- |
| CLAIM 6, | COLUMN 11, | LINE 60, | change "forming" to --removing a portion of material from the plurality of areas of the oxide at locations between adjacent portions of the plurality of spacers to form-- and delete "below" |
| CLAIM 6, | COLUMN 11, | LINE 61, | delete "the oxide layer" and change "substrate," to --substrate;-- |

CERTIFICATE OF CORRECTION (continued)
U.S. Pat. No. 7,749,860 B2

In the claims (continued):

| | | | |
|---|---|---|---|
| CLAIM 6, | COLUMN 11, | LINES 62-65, | delete "wherein each isolation trench is adjacent to and below a pair of the spacers and is situated at a corresponding area of the plurality of areas, and wherein each isolation trench has an edge;" |
| CLAIM 6, | COLUMN 12, | LINE 1, | change "filling each isolation trench with" to --implanting ions in the plurality of isolation trenches in a direction substantially orthogonal to a plane of the oxide;--, then insert a paragraph break, insert --depositing-- before "a conformal" and change "layer," to --material filling each isolation trench,-- |
| CLAIM 6, | COLUMN 12, | LINE 2, | change "layer" to --material--, change "above" to --over remaining portions of--, and after "oxide" delete "layer" |
| CLAIM 6, | COLUMN 12, | LINE 4, | change "filling is performed by" to --the-- and delete "the conformal layer" |
| CLAIM 6, | COLUMN 12, | LINE 5, | delete "and depositing" |
| CLAIM 6, | COLUMN 12, | LINE 7, | change "layer" to --material-- |
| CLAIM 6, | COLUMN 12, | LINE 8, | change "layer;" to --material;-- |
| CLAIM 6, | COLUMN 12, | LINES 9-10, | change "substantially simultaneously subjecting an entire upper surface contour" to --removing portions-- and change "layer to a" to --material that overlie the remaining portions of the oxide by-- |
| CLAIM 6, | COLUMN 12, | LINE 11, | delete "process and planarizing" and change "layer" to --material-- |
| CLAIM 6, | COLUMN 12, | LINE 12, | delete "therefrom" |
| CLAIM 6, | COLUMN 12, | LINE 14, | delete "fusing the oxide layer, spacers and conformal layer;" |
| CLAIM 6, | COLUMN 12, | LINE 15, | before "wherein" insert --removing the first dielectric material and portions of the oxide underlying the first dielectric material such that the conformal material fills each isolation trench, extends horizontally away from each isolation trench upon remaining portions of the oxide and sidewalls of the conformal material begin on an upper surface of the semiconductor substrate and are oriented substantially orthogonal to the upper surface contour of the conformal material-- |
| CLAIM 6, | COLUMN 12, | LINE 16, | change "layer comprises a material that" to --material-- |
| CLAIM 6, | COLUMN 12, | LINE 19, | change "layer" to --material-- |
| CLAIM 6, | COLUMN 12, | LINE 21, | change "layer" to --material-- |
| CLAIM 6, | COLUMN 12, | LINE 22, | change "oxide layer; and" to --oxide; and-- |
| CLAIM 6, | COLUMN 12, | LINE 23, | change "layer" to --material-- |
| CLAIM 6, | COLUMN 12, | LINE 24, | change "oxide layer." to --oxide.-- |
| CLAIM 9, | COLUMN 12, | LINE 36, | change "material the ratio is" to --material using an etch recipe that etches the conformal material faster than the first dielectric material by a ratio-- and change "from about" to --of from about-- |
| CLAIM 10, | COLUMN 12, | LINE 38, | change "overlying" to --that overlie-- |

In the claims (continued):

| | | | |
|---|---|---|---|
| CLAIM 13, | COLUMN 12, | LINE 61, | change "oxide layer" to --oxide-- |
| CLAIM 13, | COLUMN 12, | LINE 62, | change "nitride layer" to --nitride-- and change "oxide layer;" to --oxide;-- |
| CLAIM 13, | COLUMN 12, | LINE 63, | change "nitride layer" to --nitride-- and after "expose" insert --a plurality of areas of-- |
| CLAIM 13, | COLUMN 12, | LINE 64, | change "oxide layer at a plurality of areas;" to --oxide;-- |
| CLAIM 13, | COLUMN 12, | LINE 65, | change "layer over the oxide layer" to --material over-- |
| CLAIM 13, | COLUMN 12, | LINE 66, | delete "and over," and delete "layer, wherein forming a first" |
| CLAIM 13, | COLUMN 12, | LINE 67, | delete "silicon dioxide layer includes forming a first silicon" |
| CLAIM 13, | COLUMN 13, | LINE 1, | delete "dioxide layer on" and change "the exposed oxide" to --the plurality of exposed areas of the oxide;-- |
| CLAIM 13, | COLUMN 13, | LINE 2, | delete "layer at the plurality of areas;" |
| CLAIM 13, | COLUMN 13, | LINE 3, | change "layer" to --material-- |
| CLAIM 13, | COLUMN 13, | LINE 4, | change "from the first silicon dioxide layer," to --at the peripheral edges of the plurality of exposed areas of-- |
| CLAIM 13, | COLUMN 13, | LINE 5, | delete "wherein each spacer is situated upon" and delete "layer, is" |
| CLAIM 13, | COLUMN 13, | LINES 6-7, | change "silicon nitride layer, and is adjacent to an area of the plurality of areas;" to --lateral edges of the silicon nitride;-- |
| CLAIM 13, | COLUMN 13, | LINE 8, | change "forming" to --removing a portion of material from the plurality of areas at locations between adjacent portions of the plurality of spacers to form-- and change "below" to --into -- |
| CLAIM 13, | COLUMN 13, | LINE 9, | delete "the oxide layer into and terminating within" |
| CLAIM 13, | COLUMN 13, | LINES 10-13, | change "substrate, wherein each isolation trench is adjacent to and below a pair of the spacers and is situated at a corresponding area of the plurality of areas, and wherein each isolation trench has a top edge;" to --substrate;-- |
| CLAIM 13, | COLUMN 13, | LINES 17-21, | change "trench, the liner being confined preferentially within each isolation trench and extending from an interface thereof with the oxide layer to the termination of the isolation trench within the semiconductor substrate;" to --trench;-- |
| CLAIM 13, | COLUMN 13, | LINE 22, | change "filling each isolation trench with" to --implanting ions in the plurality of isolation trenches in a direction substantially orthogonal to a plane of the oxide;--, insert a paragraph break, and then insert --depositing-- |
| CLAIM 13, | COLUMN 13, | LINE 23, | change "layer, the conformal second silicon dioxide" to --material filling-- |
| CLAIM 13, | COLUMN 13, | LINE 24, | delete "layer within" and change "trench extending above" to --trench, the conformal second silicon dioxide material within each isolation trench and extending over remaining portions of-- |

CERTIFICATE OF CORRECTION (continued)
U.S. Pat. No. 7,749,860 B2

In the claims (continued):

| | | | |
|---|---|---|---|
| CLAIM 13, | COLUMN 13, | LINE 25, | delete "layer" |
| CLAIM 13, | COLUMN 13, | LINE 26, | change "wherein filling is performed by depositing the" to --the-- |
| CLAIM 13, | COLUMN 13, | LINE 27, | delete "conformal second silicon dioxide layer, and" |
| CLAIM 13, | COLUMN 13, | LINE 30, | delete "layer" |
| CLAIM 13, | COLUMN 13, | LINE 31, | change "dioxide layer;" to --dioxide material;-- |
| CLAIM 13, | COLUMN 13, | LINE 32, | delete "substantially simultaneously subjecting an entire upper" |
| CLAIM 13, | COLUMN 13, | LINE 33, | change "surface contour" to --removing portions-- |
| CLAIM 13, | COLUMN 13, | LINE 34, | change "layer to a" to --material by-- and delete "process so as to remove" |
| CLAIM 13, | COLUMN 13, | LINE 35, | change "dioxide layer" to --dioxide material-- |
| CLAIM 13, | COLUMN 13, | LINE 37, | change "surfaces and being situated" to --surfaces,-- |
| CLAIM 13, | COLUMN 13, | LINE 38, | delete "above the oxide layer," and change "a material that is" to --an-- |
| CLAIM 13, | COLUMN 13, | LINE 39, | after "insulative" insert --material-- |
| CLAIM 13, | COLUMN 13, | LINES 41-42, | change "fusing the oxide layer, liner, spacers, and conformal second silicon dioxide layer." to --removing the silicon nitride and portions of the oxide underlying the silicon nitride such that the conformal second silicon dioxide material fills each isolation trench, extends horizontally away from each isolation trench upon remaining portions of the oxide and sidewalls of the second silicon dioxide material start on an upper surface of the semiconductor substrate and lie substantially orthogonal to the upper surface contour of the second silicon dioxide material.-- |
| CLAIM 17, | COLUMN 13, | LINE 54, | change "oxide layer" to --oxide-- |
| CLAIM 17, | COLUMN 13, | LINE 55, | change "a polysilicon layer" to --polysilicon-- and change "oxide layer;" to --oxide;-- |
| CLAIM 17, | COLUMN 13, | LINE 56, | change "dielectric layer" to --dielectric material-- and change "polysilicon layer;" to --polysilicon;-- |
| CLAIM 17, | COLUMN 13, | LINE 57, | change "dielectric layer" to --dielectric material-- |
| CLAIM 17, | COLUMN 13, | LINES 58-59, | change "layer to expose" to --to expose-- and after "expose" insert --a plurality of areas of-- and change "oxide layer at a plurality of areas:" to --oxide:-- |
| CLAIM 17, | COLUMN 13, | LINE 60, | change "dielectric layer" to --dielectric material-- |
| CLAIM 17, | COLUMN 13, | LINE 61, | change "oxide layer, the polysilicon layer, and" to --polysilicon,-- |
| CLAIM 17, | COLUMN 13, | LINES 62-65, | change "layer, wherein the forming a second dielectric layer includes forming a second dielectric layer on and in contact with the exposed oxide layer at the plurality of areas;" to --material and in contact with the plurality of exposed areas of the oxide;-- |
| CLAIM 17, | COLUMN 13, | LINE 66, | change "dielectric layer" to --dielectric material-- |

CERTIFICATE OF CORRECTION (continued)
U.S. Pat. No. 7,749,860 B2

In the claims (continued):

| | | | |
|---|---|---|---|
| CLAIM 17, | COLUMN 13, | LINE 67, | change "from the second dielectric layer," to --at peripheral edges of the plurality of exposed areas of the oxide-- |
| CLAIM 17, | COLUMN 14, | LINE 1, | delete "wherein each spacer is upon the oxide layer, is" |
| CLAIM 17, | COLUMN 14, | LINE 2, | change "both the polysilicon layer and" to --lateral edges of-- |
| CLAIM 17, | COLUMN 14, | LINE 3, | change "layer, and is adjacent to an area of the plurality of areas;" to --material;-- |
| CLAIM 17, | COLUMN 14, | LINE 4, | change "forming" to --removing a portion of material from the plurality of areas of the oxide at locations between adjacent portions of the plurality of spacers to form-- and delete "below" |
| CLAIM 17, | COLUMN 14, | LINE 5, | delete "the oxide layer and from top edges" |
| CLAIM 17, | COLUMN 14, | LINES 6-9, | change "substrate, wherein each isolation trench is adjacent to and below a pair of the spacers and is situated at a corresponding area of the plurality of areas;" to --substrate;-- |
| CLAIM 17, | COLUMN 14, | LINE 11, | before "filling" insert --implanting ions in the plurality of isolation trenches in a direction substantially orthogonal to a plane of the oxide;--, insert a paragraph break, insert --depositing a conformal third material--, and delete "with a conformal third layer," |
| CLAIM 17, | COLUMN 14, | LINE 12, | change "layer extending above" to --material extending over remaining portions of-- |
| CLAIM 17, | COLUMN 14, | LINE 13, | delete "layer" |
| CLAIM 17, | COLUMN 14, | LINE 14, | delete "filling is performed by depositing the conformal" |
| CLAIM 17, | COLUMN 14, | LINE 15, | delete "third layer, and" |
| CLAIM 17, | COLUMN 14, | LINE 17, | change "dielectric layer" to --dielectric material-- |
| CLAIM 17, | COLUMN 14, | LINE 18, | change "third layer;" to --third material;-- |
| CLAIM 17, | COLUMN 14, | LINES 19-20, | change "substantially simultaneously subjecting an entire upper surface contour" to --removing portions-- and change "layer to a" to --material by-- |
| CLAIM 17, | COLUMN 14, | LINE 21, | delete "process and planarizing" |
| CLAIM 17, | COLUMN 14, | LINE 22, | change "layer" to --material-- and delete "therefrom" |
| CLAIM 17, | COLUMN 14, | LINE 25, | change "fusing the oxide layer, spacers and conformal third layer;" to --removing the first dielectric material, polysilicon and portions of the oxide underlying the first dielectric material such that the conformal third material fills each isolation trench, extends horizontally away from each isolation trench upon remaining portions of the oxide and sidewalls of the conformal third material extend from an upper surface of the semiconductor substrate to the upper surface contour of the conformal third material and the sidewalls are substantially orthogonal to the upper surface contour of the conformal third material;-- |

CERTIFICATE OF CORRECTION (continued)
U.S. Pat. No. 7,749,860 B2

In the claims (continued):

| | | | |
|---|---|---|---|
| CLAIM 17, | COLUMN 14, | LINE 30, | change "third layer," to --third material,-- |
| CLAIM 18, | COLUMN 14, | LINES 32-33, | change "the upper surface for each isolation trench is formed" to --removing portions of the conformal third material comprises removing portions of the conformal third material-- |
| CLAIM 22, | COLUMN 14, | LINE 52, | change "oxide layer" to --oxide-- |
| CLAIM 22, | COLUMN 14, | LINE 53, | change "a polysilicon layer" to --polysilicon-- and change "oxide layer;" to --oxide;-- |
| CLAIM 22, | COLUMN 14, | LINE 54, | change "dielectric layer" to --dielectric material-- and change "polysilicon layer;" to --polysilicon;-- |
| CLAIM 22, | COLUMN 14, | LINES 55-57, | change "dielectric layer" to --dielectric material--, change "polysilicon layer" to --polysilicon--, and change "expose the oxide layer at a plurality of areas;" to --expose a plurality of areas of the oxide;-- |
| CLAIM 22, | COLUMN 14, | LINE 58, | change "dielectric layer conformally" to --dielectric material-- |
| CLAIM 22, | COLUMN 14, | LINE 59, | delete "oxide layer, the" and change "polysilicon layer, and" to --polysilicon,-- |
| CLAIM 22, | COLUMN 14, | LINES 60-62, | change "layer, wherein forming a second dielectric layer includes forming a second dielectric layer on and in contact with the exposed oxide layer at the plurality of areas;" to --material and in contact with the plurality of exposed areas of the oxide;-- |
| CLAIM 22, | COLUMN 14, | LINE 63, | change "dielectric layer" to --dielectric material-- |
| CLAIM 22, | COLUMN 14, | LINE 64, | change "from the second dielectric layer," to --at the peripheral edges of the plurality of exposed areas of-- |
| CLAIM 22, | COLUMN 14, | LINE 65, | change "wherein each spacer is upon the oxide layer, is" to --the oxide-- |
| CLAIM 22, | COLUMN 14, | LINE 66, | change "both the polysilicon layer and" to --lateral edges of-- |
| CLAIM 22, | COLUMN 14, | LINE 67, | change "layer, and is adjacent to an area of the plurality of areas;" to --material;-- |
| CLAIM 22, | COLUMN 15, | LINE 1, | change "forming" to --removing a portion of material from the plurality of exposed areas of the oxide at locations between adjacent portions of the plurality of spacers to form-- and delete "below" |
| CLAIM 22, | COLUMN 15, | LINE 2, | delete "the oxide layer and from top edges" |
| CLAIM 22, | COLUMN 15, | LINES 3-6, | change "substrate, wherein each isolation trench of the plurality of isolation trenches is adjacent to and below a pair of the spacers and is situated at a corresponding area of the plurality of areas;" to --substrate;-- |
| CLAIM 22, | COLUMN 15, | LINES 7-8, | change "rounding the top edges of each isolation trench of the plurality of isolation trenches;" to --implanting ions in the plurality of isolation trenches in a direction substantially orthogonal to a plane of the oxide;-- |

CERTIFICATE OF CORRECTION (continued)
U.S. Pat. No. 7,749,860 B2

In the claims (continued):

| | | | |
|---|---|---|---|
| CLAIM 22, | COLUMN 15, | LINES 9-10, | change "filling each isolation trench of the plurality of isolation trenches with" to --depositing-- and change "layer," to --material filling each isolation trench,-- |
| CLAIM 22, | COLUMN 15, | LINE 11, | change "third layer" to --third material-- and change "above the oxide layer" to --over remaining portions of the oxide-- |
| CLAIM 22, | COLUMN 15, | LINE 12, | delete "filling" |
| CLAIM 22, | COLUMN 15, | LINE 13, | delete "is performed by depositing the conformal third layer," |
| CLAIM 22, | COLUMN 15, | LINE 14, | delete "and" |
| CLAIM 22, | COLUMN 15, | LINE 16, | change "dielectric layer" to --dielectric material-- |
| CLAIM 22, | COLUMN 15, | LINE 17, | change "third layer;" to --third material;-- |
| CLAIM 22, | COLUMN 15, | LINE 18, | delete "substantially simultaneously subjecting an entire upper" |
| CLAIM 22, | COLUMN 15, | LINE 19, | change "surface contour" to --removing portions-- and change "third layer to a" to --third material by-- |
| CLAIM 22, | COLUMN 15, | LINE 20, | delete "process and planarizing" |
| CLAIM 22, | COLUMN 15, | LINE 21, | change "layer" to --material-- and delete "therefrom" |
| CLAIM 22, | COLUMN 15, | LINES 23-24, | insert a paragraph break after "and" and then change "fusing the oxide layer, spacers and conformal third layer;" to --removing the first dielectric material, polysilicon and portions of the oxide underlying the first dielectric material such that the conformal third material fills each isolation trench, extends horizontally away from each isolation trench upon remaining portions of the oxide and sidewalls of the conformal third material extend from an upper surface of the semiconductor substrate to the upper surface contour of the conformal third material and the sidewalls are oriented substantially orthogonal to the upper surface contour of the conformal third material;-- |
| CLAIM 22, | COLUMN 15, | LINE 25, | change "third layer is an" to --third material is-- |
| CLAIM 22, | COLUMN 15, | LINE 26, | change "material that" to --and-- |
| CLAIM 22, | COLUMN 15, | LINE 30, | change "third layer," to --third material,-- |
| CLAIM 22, | COLUMN 15, | LINE 31, | change "layer; and" to --material; and-- |
| CLAIM 22, | COLUMN 15, | LINE 33, | change "third layer," to --third material,-- |
| CLAIM 23, | COLUMN 15, | LINE 37, | change "oxide layer" to --oxide-- |
| CLAIM 23, | COLUMN 15, | LINE 38, | change "polysilicon layer" to --first polysilicon material-- and change "oxide layer;" to --oxide;-- |
| CLAIM 23, | COLUMN 15, | LINE 39, | change "dielectric layer" to --dielectric material-- and change "polysilicon layer;" to --first polysilicon material;-- |
| CLAIM 23, | COLUMN 15, | LINE 40, | change "dielectric layer" to --dielectric material-- and after "and the" insert --first-- |
| CLAIM 23, | COLUMN 15, | LINES 41-42, | change "layer to expose the oxide layer at a plurality of areas;" to --material to expose a plurality of areas of the oxide;-- |

CERTIFICATE OF CORRECTION (continued)
U.S. Pat. No. 7,749,860 B2

In the claims (continued):

| | | | |
|---|---|---|---|
| CLAIM 23, | COLUMN 15, | LINE 43, | change "dielectric layer conformally" to --dielectric material-- |
| CLAIM 23, | COLUMN 15, | LINE 44, | delete "oxide layer, the polysilicon layer, and the" |
| CLAIM 23, | COLUMN 15, | LINE 45, | delete "layer, wherein the forming a second dielectric layer" |
| CLAIM 23, | COLUMN 15, | LINE 46, | change "includes forming a second dielectric layer on" to --material-- |
| CLAIM 23, | COLUMN 15, | LINES 47-48, | after "with the" insert --plurality of-- and change "oxide layer at the plurality of areas;" to --areas of the oxide;-- |
| CLAIM 23, | COLUMN 15, | LINE 49, | change "dielectric layer" to --dielectric material-- |
| CLAIM 23, | COLUMN 15, | LINE 50, | change "from the second dielectric layer," to --at peripheral edges of the plurality of exposed areas of-- |
| CLAIM 23, | COLUMN 15, | LINE 51, | delete "wherein each spacer of the plurality of spacers is upon" |
| CLAIM 23, | COLUMN 15, | LINE 52, | change "oxide layer, is" to --oxide in-- and change "both the polysilicon" to --lateral edges of-- |
| CLAIM 23, | COLUMN 15, | LINES 53-54, | delete "layer and" and change "dielectric layer, and is adjacent to an area of the plurality of areas;" to --dielectric material;-- |
| CLAIM 23, | COLUMN 15, | LINE 55, | change "forming" to --removing a portion of material from the plurality of exposed areas of the oxide at locations between adjacent portions of the plurality of spacers to form-- and delete "below" |
| CLAIM 23, | COLUMN 15, | LINE 56, | delete "the oxide layer and from top edges" |
| CLAIM 23, | COLUMN 15, | LINES 57-60, | change "substrate, wherein each isolation trench of the plurality of isolation trenches is adjacent to and below a pair of the spacers and is situated at a corresponding area of the plurality of areas;" to --substrate;-- |
| CLAIM 23, | COLUMN 15, | LINE 62, | before "filling" insert --implanting ions in the plurality of isolation trenches in a direction substantially orthogonal to a plane of the oxide;--, insert a paragraph break, and then insert --depositing a conformal third material-- and change "trench with a conformal third layer," to --trench,-- |
| CLAIM 23, | COLUMN 15, | LINE 63, | change "third layer extending above" to --third material extending over remaining portions of-- |
| CLAIM 23, | COLUMN 15, | LINE 64, | delete "layer" |
| CLAIM 23, | COLUMN 15, | LINE 65, | delete "filling is performed by depositing the conformal" |
| CLAIM 23, | COLUMN 15, | LINE 66, | delete "third layer, and" |
| CLAIM 23, | COLUMN 16, | LINE 1, | change "dielectric layer" to --dielectric material-- |
| CLAIM 23, | COLUMN 16, | LINE 2, | change "third layer;" to --third material;-- |
| CLAIM 23, | COLUMN 16, | LINE 3, | delete "substantially simultaneously subjecting an entire upper" |

In the claims (continued):

| | | | |
|---|---|---|---|
| CLAIM 23, | COLUMN 16, | LINE 4, | change "surface contour" to --removing portions-- and change "third layer to a" to --third material overlying the remaining portions of the oxide by-- |
| CLAIM 23, | COLUMN 16, | LINE 5, | delete "process and planarizing" |
| CLAIM 23, | COLUMN 16, | LINE 6, | change "layer" to --material-- and delete "therefrom" |
| CLAIM 23, | COLUMN 16, | LINE 8, | change "oxide layer" to --oxide-- |
| CLAIM 23, | COLUMN 16, | LINE 10, | change "oxide layer" to --oxide-- |
| CLAIM 23, | COLUMN 16, | LINE 13, | change "layer composed of" to --second-- |
| CLAIM 23, | COLUMN 16, | LINE 14, | after "polysilicon" insert --material-- and delete "layer" |
| CLAIM 23, | COLUMN 16, | LINE 16, | change "third layer," to --conformal third material,-- |
| CLAIM 23, | COLUMN 16, | LINE 17, | change "layer composed of polysilicon" to --second polysilicon material-- |
| CLAIM 23, | COLUMN 16, | LINE 19, | change "fusing the oxide layer, spacers and conformal third layer;" to --removing the first dielectric material, first polysilicon material and portions of the oxide underlying the first dielectric material such that the conformal third material fills each isolation trench, extends horizontally away from each isolation trench upon remaining portions of the oxide and sidewalls of the conformal third material originate on an upper surface of the semiconductor substrate and extend to the upper surface contour of the conformal third material, the sidewalls are oriented substantially orthogonal to the upper surface contour of the conformal third material;-- |
| CLAIM 24, | COLUMN 16, | LINE 25, | delete "forming an oxide layer upon a semiconductor substrate;" |
| CLAIM 24, | COLUMN 16, | LINE 26, | change "a polysilicon layer" to --polysilicon-- and change "the oxide layer;" to --an oxide overlying a semiconductor substrate;-- |
| CLAIM 24, | COLUMN 16, | LINE 27, | change "dielectric layer" to --dielectric material-- and change "polysilicon layer;" to --polysilicon;-- |
| CLAIM 24, | COLUMN 16, | LINE 28, | change "dielectric layer" to --dielectric material-- |
| CLAIM 24, | COLUMN 16, | LINE 29, | change "layer to expose the oxide layer at a plurality of" to --to expose a plurality of areas of the oxide;-- |
| CLAIM 24, | COLUMN 16, | LINE 30, | delete "areas;" |
| CLAIM 24, | COLUMN 16, | LINE 31, | change "dielectric layer conformally" to --dielectric material-- |
| CLAIM 24, | COLUMN 16, | LINE 32, | change "oxide layer, the polysilicon layer," to --polysilicon,-- |
| CLAIM 24, | COLUMN 16, | LINE 33, | change "layer, wherein the forming a second dielectric layer" to --material-- |
| CLAIM 24, | COLUMN 16, | LINE 34, | delete "includes forming a second dielectric layer on" |
| CLAIM 24, | COLUMN 16, | LINE 35, | after "with the" insert --plurality of-- and change "oxide layer at the plurality of" to --areas of the oxide;-- |
| CLAIM 24, | COLUMN 16, | LINE 36, | delete "areas;" |

CERTIFICATE OF CORRECTION (continued)
U.S. Pat. No. 7,749,860 B2

In the claims (continued):

| | | | |
|---|---|---|---|
| CLAIM 24, | COLUMN 16, | LINE 37, | change "dielectric layer" to --dielectric material-- |
| CLAIM 24, | COLUMN 16, | LINE 38, | change "from the second dielectric layer," to --at peripheral edges of the plurality of exposed areas of-- |
| CLAIM 24, | COLUMN 16, | LINE 39, | delete "wherein each spacer of the plurality of spacers is upon" |
| CLAIM 24, | COLUMN 16, | LINE 40, | delete "layer, is" and change "both the polysilicon" to --lateral edges of-- |
| CLAIM 24, | COLUMN 16, | LINE 41, | delete "layer and" and change "layer, and is adjacent to an" to --material;-- |
| CLAIM 24, | COLUMN 16, | LINE 42, | delete "area of the plurality of areas;" |
| CLAIM 24, | COLUMN 16, | LINE 43, | change "forming" to --removing material from the plurality of exposed areas of the oxide at locations between adjacent portions of the plurality of spacers to form-- and delete "below" |
| CLAIM 24, | COLUMN 16, | LINE 44, | delete "the oxide layer and from top edges" |
| CLAIM 24, | COLUMN 16, | LINES 45-48, | change "substrate, wherein each isolation trench of the plurality of isolation trenches is adjacent to and below a pair of the spacers and is situated at a corresponding area of the plurality of areas;" to --substrate;-- |
| CLAIM 24, | COLUMN 16, | LINE 50, | after "trenches;" insert a paragraph break and then insert --implanting ions in the plurality of isolation trenches in a direction substantially orthogonal to a plane of the oxide;-- |
| CLAIM 24, | COLUMN 16, | LINE 51, | before "filling" insert --depositing a conformal third material-- and change "trench with a conformal third layer," to --trench,-- |
| CLAIM 24, | COLUMN 16, | LINE 52, | change "third layer extending above" to --third material extending over remaining portions of-- |
| CLAIM 24, | COLUMN 16, | LINE 53, | change "layer in" to --in-- |
| CLAIM 24, | COLUMN 16, | LINE 54, | delete "filling is performed by depositing the conformal" |
| CLAIM 24, | COLUMN 16, | LINE 55, | delete "third layer, and" |
| CLAIM 24, | COLUMN 16, | LINE 57, | change "dielectric layer" to --dielectric material-- |
| CLAIM 24, | COLUMN 16, | LINE 58, | change "third layer;" to --third material;-- |
| CLAIM 24, | COLUMN 16, | LINE 59, | delete "substantially simultaneously subjecting an entire upper" |
| CLAIM 24, | COLUMN 16, | LINE 60, | change "surface contour" to --removing portions--and change "layer to a" to --material overlying the remaining portions of the oxide by-- |
| CLAIM 24, | COLUMN 16, | LINE 61, | change "process comprising" to --the conformal third material to form therefrom an upper surface for each isolation trench that is co-planar to the other upper surfaces using-- |
| CLAIM 24, | COLUMN 16, | LINE 62, | change "third layer" to --third material-- |
| CLAIM 24, | COLUMN 16, | LINE 63, | change "dielectric" to --dielectric material-- and change "range from" to --range of from-- |

In the claims (continued):

| | | | |
|---|---|---|---|
| CLAIM 24, | COLUMN 16, | LINES 64-66, | change "2:1 and planarizing the conformal third layer to form therefrom an upper surface for each isolation trench that is co-planar to the other upper surfaces; and" to --2:1;-- |
| CLAIM 24, | COLUMN 16, | LINE 67, | change "fusing the oxide layer," to --heat treating the oxide,-- change "third layer;" to --third material to fuse the oxide, spacers and conformal third material; and--, insert a paragraph break and then insert --removing the first dielectric material, polysilicon, and portions of the oxide underlying the first dielectric material such that the conformal third material fills each isolation trench, extends horizontally away from each isolation trench upon remaining portions of the oxide and sidewalls of the conformal third material originate on an upper surface of the semiconductor substrate to the upper surface contour of the conformal third material and the sidewalls are substantially orthogonal to the upper surface contour of the conformal third material;-- |
| CLAIM 24, | COLUMN 17, | LINE 5, | change "third layer," to --third material,-- |
| CLAIM 24, | COLUMN 17, | LINES 6-11, | delete "corresponding pair of the spacers, wherein depositing is carried out to the extent of filling each isolation trench and extending over the spacers and over the first dielectric material so as to define an upper surface contour of the conformal third material;" |
| CLAIM 26, | COLUMN 17, | LINE 16, | change "oxide layer" to --oxide-- |
| CLAIM 26, | COLUMN 17, | LINE 17, | change "polysilicon layer" to --first polysilicon material-- and change "oxide layer;" to --oxide;-- |
| CLAIM 26, | COLUMN 17, | LINE 18, | change "a silicon nitride layer" to --silicon nitride-- and change "polysilicon layer;" to --first polysilicon material;-- |
| CLAIM 26, | COLUMN 17, | LINE 19, | change "layer and the" to --and the first-- |
| CLAIM 26, | COLUMN 17, | LINE 20, | change "layer to expose" to --material to expose a plurality of areas of-- and change "layer at a plurality" to --material;-- |
| CLAIM 26, | COLUMN 17, | LINE 21, | delete "of areas;" |
| CLAIM 26, | COLUMN 17, | LINE 22, | change "layer over the pad oxide" to --material over-- |
| CLAIM 26, | COLUMN 17, | LINES 23-25, | delete "layer and over" and delete "layer, wherein the forming a first silicon dioxide layer includes forming a first silicon dioxide layer on" |
| CLAIM 26, | COLUMN 17, | LINE 26, | delete "layer" and change "areas;" to --exposed areas of the pad oxide;-- |
| CLAIM 26, | COLUMN 17, | LINE 27, | change "dioxide layer" to --dioxide material-- |
| CLAIM 26, | COLUMN 17, | LINES 28-29, | change "from the first silicon dioxide layer, wherein each spacer of the plurality of spacers is situated" to --at peripheral edges of the plurality of exposed areas of-- |

In the claims (continued):

| | | | |
|---|---|---|---|
| CLAIM 26, | COLUMN 17, | LINE 30, | delete "upon," delete "layer, is" and after "with" insert --lateral edges of-- |
| CLAIM 26, | COLUMN 17, | LINE 31, | change "nitride layer and the polysilicon layer, and is adjacent to" to --nitride and the first polysilicon material;-- |
| CLAIM 26, | COLUMN 17, | LINE 32, | delete "an area of the plurality of areas;" |
| CLAIM 26, | COLUMN 17, | LINE 33, | change "forming" to --removing a portion of material from the plurality of exposed areas at locations between adjacent portions of the plurality of spacers to form-- and delete "below" |
| CLAIM 26, | COLUMN 17, | LINE 34, | delete "the pad oxide layer and from top edges" |
| CLAIM 26, | COLUMN 17, | LINE 41, | change "substrate;" to --substrate by implanting ions in the plurality of isolation trenches in a direction substantially orthogonal to a plane of the pad oxide;-- |
| CLAIM 26, | COLUMN 17, | LINE 44, | delete "layer" |
| CLAIM 26, | COLUMN 17, | LINE 47, | before "filling" insert --depositing a conformal second material-- and delete "with a conformal second layer," |
| CLAIM 26, | COLUMN 17, | LINE 48, | change "layer extending above" to --material extending over remaining portions of-- |
| CLAIM 26, | COLUMN 17, | LINE 49, | delete "layer" |
| CLAIM 26, | COLUMN 17, | LINE 50, | delete "filling is performed by depositing the" |
| CLAIM 26, | COLUMN 17, | LINE 51, | delete "conformal second layer, and" |
| CLAIM 26, | COLUMN 17, | LINE 53, | delete "layer" |
| CLAIM 26, | COLUMN 17, | LINE 55, | change "layer;" to --material;-- |
| CLAIM 26, | COLUMN 17, | LINE 56, | delete "substantially simultaneously subjecting an entire upper" |
| CLAIM 26, | COLUMN 17, | LINE 57, | change "surface contour" to --removing a portion-- and change "layer to a" to --material by-- |
| CLAIM 26, | COLUMN 17, | LINE 58, | delete "process and planarizing" |
| CLAIM 26, | COLUMN 17, | LINE 59, | change "layer" to --material-- and delete "therefrom" |
| CLAIM 26, | COLUMN 17, | LINES 61-62, | change "pad oxide layer; and" to --pad oxide;-- |
| CLAIM 26, | COLUMN 17, | LINE 63, | change "fusing" to --heat treating the pad oxide, liner, spacers and conformal second material to fuse-- and change "oxide layer," to --oxide,-- |
| CLAIM 26, | COLUMN 17, | LINE 64, | change "second layer;" to --second material; and--, insert a paragraph break, and then insert --removing the silicon nitride, first polysilicon material and portions of the pad oxide underlying the silicon nitride such that the conformal second material fills each isolation trench, extends horizontally away from each isolation trench upon remaining portions of the pad oxide and sidewalls of the conformal second material originate on an upper surface of the semiconductor substrate and continue to the upper surface contour of the conformal second material, the sidewalls lie substantially orthogonal to the upper surface contour of the conformal second material;-- |

In the claims (continued):

| | | | |
|---|---|---|---|
| CLAIM 29, | COLUMN 18, | LINES 9-10, | delete "exposing the pad layer upon a portion of a surface of the semiconductor substrate;" |
| CLAIM 29, | COLUMN 18, | LINE 11, | change "layer upon the" to --upon a-- |
| CLAIM 29, | COLUMN 18, | LINE 14, | change "a layer composed of" to --a second-- |
| CLAIM 29, | COLUMN 18, | LINE 15, | after "polysilicon" insert --material-- and delete "layer" |
| CLAIM 29, | COLUMN 18, | LINE 16, | change "spacers," to --spacers;-- |
| CLAIM 29, | COLUMN 18, | LINE 17, | change "layer composed of polysilicon" to --second polysilicon material-- |
| CLAIM 30, | COLUMN 18, | LINES 21-22, | delete "providing a semiconductor substrate having a top surface with an oxide layer thereon;" |
| CLAIM 30, | COLUMN 18, | LINE 23, | change "a polysilicon layer upon the oxide layer;" to --polysilicon upon an oxide overlying a semiconductor substrate;-- |
| CLAIM 30, | COLUMN 18, | LINE 24, | change "first layer" to --first material-- and change "polysilicon layer;" to --polysilicon;-- |
| CLAIM 30, | COLUMN 18, | LINE 25, | change "first layer" to --first material-- |
| CLAIM 30, | COLUMN 18, | LINE 26, | change "layer to expose the oxide layer at a plurality of areas;" to --to expose a plurality of areas of the oxide;-- |
| CLAIM 30, | COLUMN 18, | LINE 28, | change "layer at the plurality of areas," to --at the plurality of areas;--, insert a paragraph break, then insert --implanting ions in the plurality of isolation trenches in a direction substantially orthogonal to a plane of the oxide;-- and then insert another paragraph break |
| CLAIM 30, | COLUMN 18, | LINE 33, | change "oxide layer" to --oxide-- and change "first layer" to --first material-- |
| CLAIM 30, | COLUMN 18, | LINE 34, | change "polysilicon layer;" to --polysilicon;-- |
| CLAIM 30, | COLUMN 18, | LINE 37, | change "layer into" to --into -- |
| CLAIM 30, | COLUMN 18, | LINE 39, | change "second layer" to --second material-- |
| CLAIM 30, | COLUMN 18, | LINE 40, | change "oxide layer" to --oxide-- |
| CLAIM 30, | COLUMN 18, | LINE 42, | change "second layer," to --second material,-- |
| CLAIM 30, | COLUMN 18, | LINE 44, | change "first layer" to --first material-- |
| CLAIM 30, | COLUMN 18, | LINE 45, | change "second layer;" to --second material;-- |
| CLAIM 30, | COLUMN 18, | LINE 47, | change "layer and" to --material and-- |
| CLAIM 30, | COLUMN 18, | LINE 48, | change "oxide layer," to --oxide,-- |
| CLAIM 30, | COLUMN 18, | LINE 51, | change "second layer" to --second material-- |
| CLAIM 30, | COLUMN 18, | LINE 53, | change "fusing the oxide layer, spacer and second layer;" to --removing the first material, polysilicon and portions of the oxide underlying the first material such that the second material fills each isolation trench, extends horizontally away from each isolation trench upon remaining portions of the oxide and sidewalls of the second material initiate on an upper surface of the semiconductor substrate and end at the upper surface contour of the second material, the sidewalls are substantially orthogonal to the upper surface contour of the second material;-- |

In the claims (continued):

| | | | |
|---|---|---|---|
| CLAIM 30, | COLUMN 18, | LINE 55, | change "second layer," to --second material,-- |
| CLAIM 31, | COLUMN 18, | LINE 57, | change "as defined in" to --according to-- |
| CLAIM 31, | COLUMN 18, | LINE 60, | before "doping" insert a paragraph break and then insert --wherein implanting ions in the plurality of isolation trenches in a direction substantially orthogonal to a plane of the oxide further comprises:-- |
| CLAIM 33, | COLUMN 19, | LINES 5-6, | delete "providing a semiconductor substrate having a top surface with an oxide layer thereon;" |
| CLAIM 33, | COLUMN 19, | LINE 7, | change "layer upon the oxide layer;" to --material upon an oxide overlying a semiconductor substrate;-- |
| CLAIM 33, | COLUMN 19, | LINE 8, | change "layer to expose the oxide" to --material to expose a plurality of areas of the oxide;-- |
| CLAIM 33, | COLUMN 19, | LINE 9, | delete "layer at a plurality of areas;" |
| CLAIM 33, | COLUMN 19, | LINE 11, | delete "layer" |
| CLAIM 33, | COLUMN 19, | LINE 16, | change "oxide layer" to --oxide-- and change "first layer;" to --first material;-- |
| CLAIM 33, | COLUMN 19, | LINE 19, | delete "layer" |
| CLAIM 33, | COLUMN 19, | LINE 21, | change "second layer" to --second material-- |
| CLAIM 33, | COLUMN 19, | LINE 22, | change "oxide layer" to --oxide-- |
| CLAIM 33, | COLUMN 19, | LINE 24, | change "second layer," to --second material,-- |
| CLAIM 33, | COLUMN 19, | LINE 26, | change "first layer" to --first material-- |
| CLAIM33, | COLUMN 19, | LINE 27, | change "second layer;" to --second material;-- |
| CLAIM 33, | COLUMN 19, | LINE 29, | change "layer" to --material-- |
| CLAIM 33, | COLUMN 19, | LINE 30, | change "oxide layer," to --oxide,-- |
| CLAIM 33, | COLUMN 19, | LINE 31, | delete "substantially simultaneously subjecting an" |
| CLAIM 33, | COLUMN 19, | LINE 32, | change "entire upper surface contour" to --removing portions-- and change "layer to a" to --material by-- |
| CLAIM 33, | COLUMN 19, | LINE 33, | change "process; and" to --the entire upper surface contour of the second material;-- |
| CLAIM 33, | COLUMN 19, | LINES 34-35, | change "fusing the oxide layer, electrically insulative material, spacer and second layer;" to --implanting ions in the plurality of isolation trenches in a direction substantially orthogonal to a plane of the oxide; and--, insert a paragraph break and then insert --removing the first material and portions of the oxide underlying the first material such that the second material fills each isolation trench, extends horizontally away from each isolation trench upon remaining portions of the oxide and sidewalls of the second material commence at an upper surface of the semiconductor substrate and end at the upper surface contour of the second material and the sidewalls are oriented substantially orthogonal to the upper surface contour of the second material;-- |
| CLAIM 33, | COLUMN 19, | LINE 37, | change "second layer," to --second material,-- |
| CLAIM 34, | COLUMN 19, | LINE 41, | change "type;" to --type; and-- |
| CLAIM 34, | COLUMN 19, | LINE 42, | delete "and" |

In the claims (continued):

| | | | |
|---|---|---|---|
| CLAIM 36, | COLUMN 19, | LINES 57-58, | delete "providing a semiconductor substrate having a top surface with an oxide layer thereon;" |
| CLAIM 36, | COLUMN 19, | LINE 59, | change "a polysilicon layer upon the oxide layer;" to --polysilicon upon an oxide overlying a semiconductor substrate;-- |
| CLAIM 36, | COLUMN 19, | LINE 60, | change "first layer" to --first material-- and change "polysilicon layer;" to --polysilicon;-- |
| CLAIM 36, | COLUMN 19, | LINE 63, | change "oxide layer" to --oxide-- and change "first layer" to --first material-- |
| CLAIM 36, | COLUMN 19, | LINE 64, | change "polysilicon layer;" to --polysilicon;-- |
| CLAIM 36, | COLUMN 19, | LINE 65, | delete "from an opening thereto" |
| CLAIM 36, | COLUMN 19, | LINE 66, | delete "at top edges at the top surface of the semiconductor" |
| CLAIM 36, | COLUMN 19, | LINE 67, | delete "substrate and below the oxide layer" |
| CLAIM 36, | COLUMN 20, | LINE 7, | change "oxide layer" to --oxide-- and change "first layer" to --first material-- |
| CLAIM 36, | COLUMN 20, | LINE 8, | change "polysilicon layer," to --polysilicon,-- |
| CLAIM 36, | COLUMN 20, | LINE 13, | change "oxide layer" to --oxide-- and change "first layer" to --first material-- |
| CLAIM 36, | COLUMN 20, | LINE 14, | change "polysilicon layer;" to --polysilicon;-- |
| CLAIM 36, | COLUMN 20, | LINE 15, | delete "from an opening thereto" |
| CLAIM 36, | COLUMN 20, | LINE 16, | delete "at top edges at the top surface of the semiconductor" |
| CLAIM 36, | COLUMN 20, | LINE 17, | delete "substrate and below the oxide layer" |
| CLAIM 36, | COLUMN 20, | LINE 26, | change "oxide layer" to --oxide-- and change "first layer" to --first material-- |
| CLAIM 36, | COLUMN 20, | LINE 27, | change "polysilicon layer," to --polysilicon,-- |
| CLAIM 36, | COLUMN 20, | LINE 32, | before "forming" insert --doping the first isolation trench and second isolation trench by implanting ions in a direction substantially orthogonal to a plane of the oxide;-- and then insert a paragraph break |
| CLAIM 36, | COLUMN 20, | LINE 35, | change "forming" to --depositing-- and change "layer, composed of" to --material comprising-- |
| CLAIM 36, | COLUMN 20, | LINE 36, | before "filling" insert --the conformal second material-- |
| CLAIM 36, | COLUMN 20, | LINES 37-38, | change "therebetween and above" to --over remaining portions of-- and delete "layer" |
| CLAIM 36, | COLUMN 20, | LINE 40, | delete "filling is performed by" |
| CLAIM 36, | COLUMN 20, | LINE 41, | delete "depositing the conformal second layer, and" |
| CLAIM 36, | COLUMN 20, | LINE 44, | change "layer" to --material-- |
| CLAIM 36, | COLUMN 20, | LINE 45, | change "layer;" to --material;-- |
| CLAIM 36, | COLUMN 20, | LINE 46, | change "substantially simultaneously subjecting an entire" to --planarizing portions of the-- |
| CLAIM 36, | COLUMN 20, | LINE 47, | change "second layer to a planarizing" to --conformal second material;-- |
| CLAIM 36, | COLUMN 20, | LINE 48, | delete "process;" |
| CLAIM 36, | COLUMN 20, | LINE 50, | change "layer" to --material-- |
| CLAIM 36, | COLUMN 20, | LINE 52, | change "oxide layer; and" to --oxide;-- |

CERTIFICATE OF CORRECTION (continued)
U.S. Pat. No. 7,749,860 B2

In the claims (continued):

| | | | |
|---|---|---|---|
| CLAIM 36, | COLUMN 20, | LINE 53, | change "fusing" to --heat treating the oxide, first spacer, second spacer and conformal second material of the first isolation structure to fuse the oxide, first spacer, second spacer and conformal second material of the first isolation structure;--, then insert a paragraph break and then change "the oxide layer," to --heat treating the oxide, first spacer, second spacer and conformal second material of the second isolation structure to fuse the oxide,-- |
| CLAIM 36, | COLUMN 20, | LINE 54, | change "second layer of the first isolation structure and" to --second material-- |
| CLAIM 36, | COLUMN 20, | LINE 55, | delete "fusing the oxide layer, first spacer, second spacer and" |
| CLAIM 36, | COLUMN 20, | LINE 56, | delete "conformal second layer" and change "structure;" to --structure; and--, insert a paragraph break and then insert --removing the first material, polysilicon and portions of the oxide underlying the first material such that the conformal second material fills each isolation trench, extends horizontally away from each isolation trench upon remaining portions of the oxide and sidewalls of the second material initiate on an upper surface of the semiconductor substrate and extend toward the upper surface contour of the second material, the sidewalls are oriented substantially orthogonal to the upper surface contour of the second material;-- |
| CLAIM 36, | COLUMN 20, | LINE 58, | change "layer," to --material,-- |
| CLAIM 37, | COLUMN 20, | LINES 62-63, | delete "providing a semiconductor substrate having a top surface with an oxide layer thereon;" |
| CLAIM 37, | COLUMN 20, | LINE 64, | change "layer upon the oxide layer;" to --material upon an oxide overlying a semiconductor substrate;-- |
| CLAIM 37, | COLUMN 20, | LINE 67, | change "oxide layer" to --oxide-- and change "first layer;" to --first material;-- |
| CLAIM 37, | COLUMN 21, | LINE 1, | delete "from an opening thereto" |
| CLAIM 37, | COLUMN 21, | LINE 2, | delete "at the top surface of the semiconductor substrate and" |
| CLAIM 37, | COLUMN 21, | LINE 3, | delete "below the oxide layer" |
| CLAIM 37, | COLUMN 21, | LINE 9, | change "oxide layer" to --oxide-- and change "first layer," to --first material,-- |
| CLAIM 37, | COLUMN 21, | LINE 15, | change "oxide layer" to --oxide-- and change "first layer;" to --first material;-- |
| CLAIM 37, | COLUMN 21, | LINE 16, | delete "below the oxide layer" |

CERTIFICATE OF CORRECTION (continued)
U.S. Pat. No. 7,749,860 B2

In the claims (continued):

| | | | |
|---|---|---|---|
| CLAIM 37, | COLUMN 21, | LINE 26, | change "oxide layer" to --oxide-- and change "first layer," to --first material,-- |
| CLAIM 37, | COLUMN 22, | LINE 1, | before "forming" insert --doping the first isolation trench and second isolation trench by implanting ions in a direction substantially orthogonal to a plane of the oxide;-- and then insert a paragraph break |
| CLAIM 37, | COLUMN 22, | LINE 4, | change "forming" to --depositing-- and change "layer composed of" to --material comprising-- |
| CLAIM 37, | COLUMN 22, | LINE 5, | change "material, conformally filling" to --material to fill-- |
| CLAIM 37, | COLUMN 22, | LINE 7, | change "therebetween and above the oxide layer" to --over remaining portions of the oxide-- |
| CLAIM 37, | COLUMN 22, | LINE 9, | delete "filling is performed" |
| CLAIM 37, | COLUMN 22, | LINE 10, | change "by depositing the conformal second layer, and" to --the-- |
| CLAIM 37, | COLUMN 22, | LINE 13, | change "first layer" to --first material-- |
| CLAIM 37, | COLUMN 22, | LINE 14, | change "second layer;" to --second material;-- |
| CLAIM 37, | COLUMN 22, | LINE 15, | delete "substantially simultaneously subjecting an entire upper" |
| CLAIM 37, | COLUMN 22, | LINE 16, | delete "surface contour of the second layer to a planarizing" |
| CLAIM 37, | COLUMN 22, | LINE 17, | delete "process and" and change "layer" to --material-- |
| CLAIM 37, | COLUMN 22, | LINES 19-25, | change "planar upper surface from the conformal the conformal second layer and the first and second spacers of the respective first and second isolation structures, and being situated above the oxide layer, wherein the microelectronic structure is defined at least in part by the active area, the conformal second layer, and the first and second isolation trenches; and" to --planar upper surface;-- |
| CLAIM 37, | COLUMN 22, | LINES 26-29, | change "fusing the oxide layer, first spacer, second spacer and conformal second layer of the first isolation structure and fusing the oxide layer, first spacer, second spacer and conformal second layer of the second isolation structure." to --heat treating the oxide, first spacer, second spacer and conformal second material of the first isolation structure to fuse the oxide, first spacer, second spacer and conformal second material of the first isolation structure;-- --heat treating the oxide, first spacer, second spacer and conformal second material of the second isolation structure to fuse the oxide, first spacer, second spacer and conformal second material of the second isolation structure; and-- |

In the claims (continued):

--removing the first material and portions of the oxide underlying the first material such that the conformal second material fills each isolation trench, extends horizontally away from each isolation trench upon remaining portions of the oxide and sidewalls of the conformal second material originate on an upper surface of the semiconductor substrate and extend toward the upper surface contour of the conformal second material, the sidewalls are oriented substantially orthogonal to the upper surface contour of the conformal second material.--